(12) United States Patent
Tsai et al.

(10) Patent No.: US 12,347,708 B2
(45) Date of Patent: Jul. 1, 2025

(54) INSPECTION APPARATUS, MANUFACTURING METHOD OF INTEGRATED CIRCUIT, AND INSPECTION METHOD

(71) Applicant: Taiwan Semiconductor Manufacturing Company, Ltd., Hsinchu (TW)

(72) Inventors: Tsung-Fu Tsai, Changhua County (TW); Szu-Wei Lu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 684 days.

(21) Appl. No.: 17/696,828

(22) Filed: Mar. 16, 2022

(65) Prior Publication Data

US 2023/0298917 A1 Sep. 21, 2023

(51) Int. Cl.
| | |
|---|---|
| *H01L 21/67* | (2006.01) |
| *G01R 31/26* | (2020.01) |
| *H01L 21/48* | (2006.01) |
| *H01L 21/56* | (2006.01) |
| *H01L 21/66* | (2006.01) |
| *H01L 21/78* | (2006.01) |

(52) U.S. Cl.
CPC .... *H01L 21/67288* (2013.01); *G01R 31/2601* (2013.01); *H01L 21/4853* (2013.01); *H01L 21/565* (2013.01); *H01L 21/78* (2013.01); *H01L 22/20* (2013.01)

(58) Field of Classification Search
CPC .......... H01L 21/67288; H01L 21/4853; H01L 21/565; H01L 21/78; H01L 22/20; H01L 21/486; H01L 23/147; H01L 23/49827; H01L 25/0655; H01L 25/50; H01L 21/561; H01L 21/6836; H01L 22/10; H01L 2221/68327; G01R 31/2601
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |

(Continued)

*Primary Examiner* — Jarrett J Stark
(74) *Attorney, Agent, or Firm* — JCIPRNET

(57) ABSTRACT

An inspection apparatus for inspecting a semiconductor workpiece includes a testing stage, a first seal member, a testing clamp, a second seal member, a semiconductor workpiece, and a transducer. The testing stage has a cavity. The first seal member is disposed in the cavity. The first seal member is attached to a sidewall of the cavity. The testing clamp is movably coupled to the testing stage. The second seal member is attached to the testing clamp. The semiconductor workpiece is held between the testing stage and the testing clamp by the first seal member and the second seal member. The transducer is movably disposed above the testing stage.

20 Claims, 24 Drawing Sheets

(56) References Cited

U.S. PATENT DOCUMENTS

| | | | |
|---|---|---|---|
| 2009/0084183 A1* | 4/2009 | Baan | G01N 29/069 |
| | | | 73/644 |
| 2020/0075533 A1* | 3/2020 | Gao | H01L 24/06 |
| 2021/0052803 A1* | 2/2021 | Rae | B01J 20/28085 |
| 2023/0298917 A1* | 9/2023 | Tsai | H01L 25/50 |
| | | | 438/15 |

* cited by examiner

INSPECTION APPARATUS, MANUFACTURING METHOD OF INTEGRATED CIRCUIT, AND INSPECTION METHOD

BACKGROUND

In the manufacturing process of integrated circuits, dies and wafers are bonded together to form a bonded structure. However, the bonding interface between the dies and wafers may be defective and an inspection process is usually performed to ensure the quality and the reliability of the bonding interface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
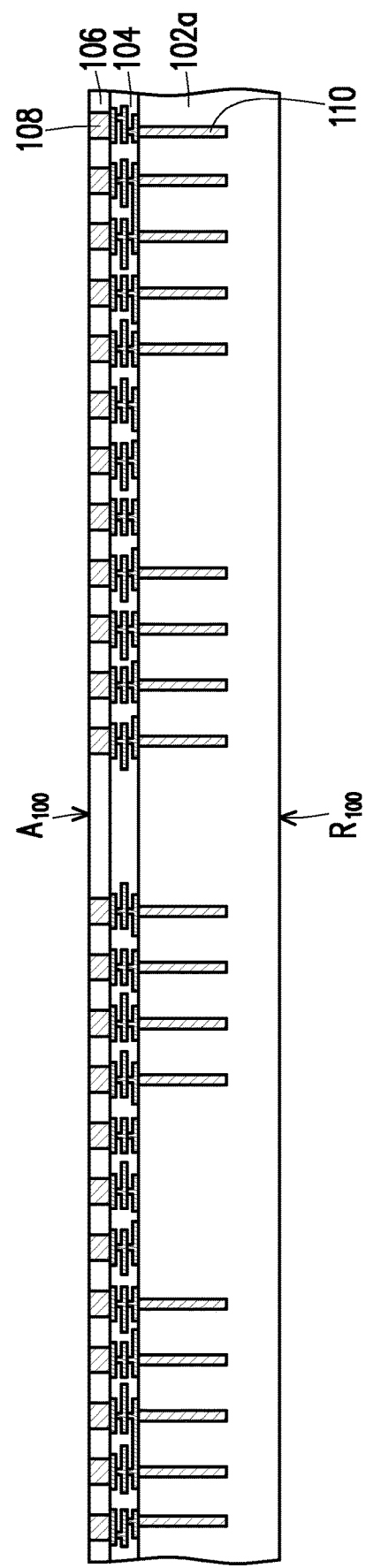
FIG. 1A to FIG. 1J are schematic cross-sectional views illustrating a manufacturing process of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a manufacturing process of an integrated circuit IC in accordance with some embodiments of the disclosure. Referring to FIG. 1A, a semiconductor wafer WS is provided. The semiconductor wafer WS includes a semiconductor substrate 102a, an interconnection structure 104, a dielectric layer 106, a plurality of conductors 108, and a plurality of through semiconductor vias (TSV) 110. In some embodiments, the semiconductor substrate 102a is a silicon substrate. In some embodiments, the semiconductor substrate 102a includes active components (e.g., transistors or the like) and/or passive components (e.g., resistors, capacitors, inductors, or the like) formed therein.

As illustrated in FIG. 1A, the interconnection structure 104 is disposed on the semiconductor substrate 102a and the dielectric layer 106 covers the interconnection structure 104. In some embodiments, the interconnection structure 104 includes a plurality of conductive patterns embedded in a dielectric material. In some embodiments, the conductors 108 are embedded in the dielectric layer 106. For example, the conductors 108 are laterally encapsulated by the dielectric layer 106. The conductors 108 are electrically connected to the semiconductor substrate 102a through the interconnection structure 104. For example, the conductors 108 may be electrically connected to the active components and/or the passive components in the semiconductor substrate 102a through the interconnection structure 104. In some embodiments, the material of the conductors 108 includes copper or other suitable metallic material while the material of the dielectric layer 106 includes silicon oxide, silicon nitride, silicon oxynitride, or other suitable dielectric materials.

In some embodiments, the dielectric layer 106 may be formed by depositing a dielectric material layer on the interconnection structure 104 and patterning the dielectric material layer to form a plurality of openings in the dielectric material layer. The openings formed in the dielectric layer 106 expose portions of the conductive patterns of the interconnection structure 104. After the dielectric layer 106 is patterned, a conductive material layer may be deposited on the dielectric layer 106 and the portions of the conductive patterns of the interconnection structure 104 exposed by the openings of the dielectric layer 106. Then, a polishing process (e.g., a chemical mechanical polishing (CMP) process) is performed to partially remove the conductive material layer until a top surface of the dielectric layer 106 is exposed. After performing the polishing process, the conductors 108 are formed in the openings of the dielectric layer 106.

In some embodiments, the TSVs 110 are embedded in the semiconductor substrate 102a and are not revealed. The TSVs 110 are electrically connected to the interconnection structure 104. In some embodiments, top surfaces of the conductors 108 and the top surface of the dielectric layer 106 are collectively referred to as an active surface $A_{100}$ of the semiconductor wafer WS. On the other hand, the surface of the semiconductor wafer WS opposite to the active surface $A_{100}$ may be referred to as a rear surface $R_{100}$ of the semiconductor wafer WS. As illustrated in FIG. 1A, the top surfaces of the conductors 108 and the top surface of the dielectric layer 106 may be substantially located at the same level height to provide an appropriate active surface $A_{100}$ for system on integrated chip (SoIC) bonding. In some embodiments, hybrid bonding may be applied to the active surface $A_{100}$.

Figure 1B:
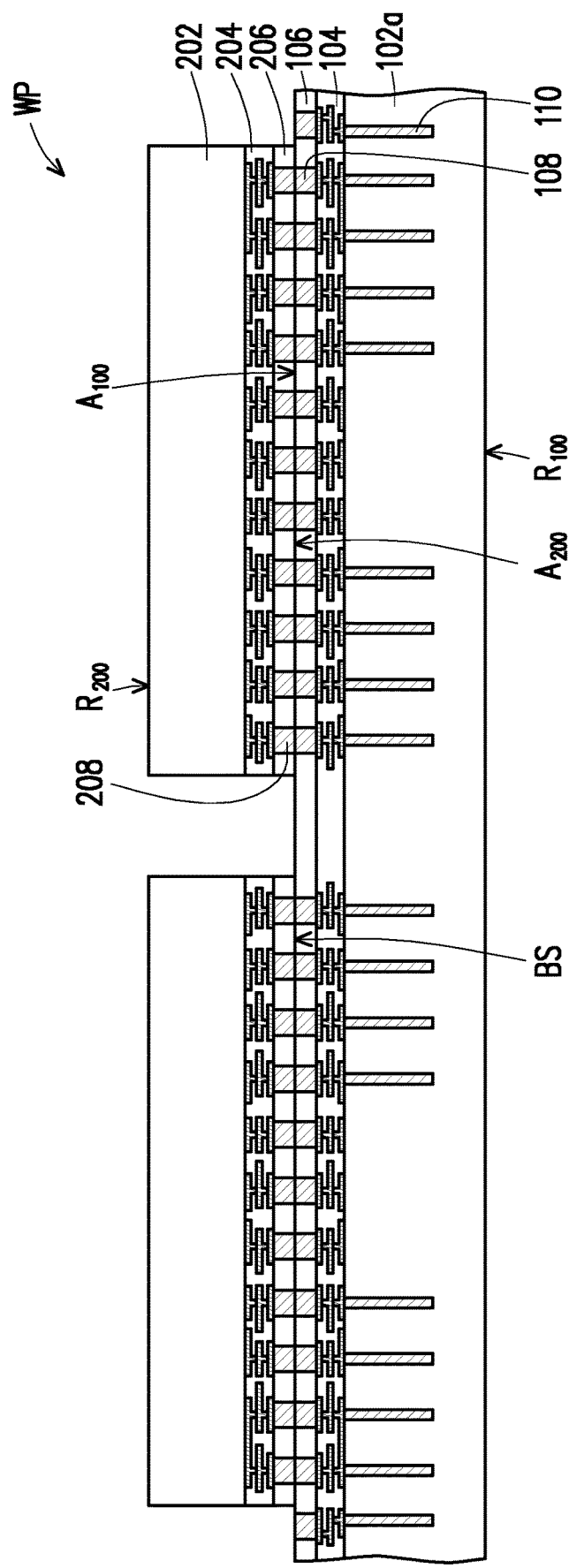

Referring to FIG. 1B, a plurality of dies 200 is picked-and-placed onto the active surface $A_{100}$ of the semiconductor wafer WS. In some embodiments, the dies 200 are arranged on the semiconductor wafer WS in an array. In some embodiments, a thickness of each die 200 ranges from about 50 μm to about 775 μm. For example, a thickness of each die may range from about 50 μm to about 250 μm. In some embodiments, each die 200 includes a semiconductor substrate 202, an interconnection structure 204, a dielectric layer 206, and a plurality of conductors 208 . . . . The semiconductor substrate 202, the interconnection structure 204, the dielectric layer 206, and the conductors 208 of the die 200 are respectively similar to the semiconductor substrate 102a, the interconnection structure 104, the dielectric layer 106, and the conductors 108 of the semiconductor wafer WS, so the detailed descriptions thereof are omitted herein. In some embodiments, the dies 200 are capable of performing logic functions. For example, the dies 200 may be Central Process Unit (CPU) dies, Graphic Process Unit (GPU) dies, Field-Programmable Gate Array (FPGA), or the like. In some embodiments, bottom surfaces of the conductors 208 and a bottom surface of the dielectric layer 206 shown in FIG. 1B are collectively referred to as an active surface $A_{200}$ of the die 200. On the other hand, the surface of the die 200 opposite to the active surface $A_{200}$ may be referred to as a rear surface $R_{200}$ of the die 200. That is, the dies 200 are being placed such that the active surfaces $A_{200}$ face the semiconductor wafer WS while the rear surfaces $R_{200}$ face upward. As illustrated in FIG. 1B, the bottom surfaces of the conductors 208 and the bottom surface of the dielectric layer 206 are substantially located at the same level height to provide an appropriate active surface $A_{200}$ for SoIC bonding.

In some embodiments, the dies 200 are pre-bonded onto the semiconductor wafer WS. For example, the dies 200 are placed such that the active surface $A_{200}$ of each die 200 is in physical contact with the active surfaces $A_{100}$ of the semiconductor wafer WS, and the conductors 208 of the dies 200 are substantially aligned and in direct contact with some of the conductors 108 of the semiconductor wafer WS. In some embodiments, to facilitate the bonding between the semiconductor wafer WS and the dies 200, surface preparation for bonding surfaces (i.e. the active surface $A_{100}$ and the active surface $A_{200}$) of the semiconductor wafer WS and the dies 200 is performed. The surface preparation may include surface cleaning and activation, for example. Surface cleaning may be performed on the active surfaces $A_{100}$, $A_{200}$ to remove particles on the top surfaces of the conductors 108, 208 and the dielectric layers 106, 206. In some embodiments, the active surfaces $A_{100}$, $A_{200}$ may be cleaned by wet cleaning, for example. Not only particles are removed, but also native oxide formed on the top surfaces of the conductors 108, 208 may be removed. The native oxide formed on the top surfaces of the conductors 108, 208 may be removed by chemicals used in wet cleaning processes, for example.

After cleaning the active surface $A_{100}$ of the semiconductor wafer WS and the active surface $A_{200}$ of the dies 200, activation of the top surfaces of the dielectric layers 106, 206 may be performed for development of high bonding strength. In some embodiments, plasma activation may be performed to treat the top surfaces of the dielectric layers 106, 206. When the activated top surface of the dielectric layer 106 is in physical contact with the activated top surface of the dielectric layer 206, the dielectric layer 106 of the semiconductor wafer WS and the dielectric layer 206 of the dies 200 are pre-bonded. In other words, the active surface $A_{100}$ of the semiconductor wafer WS and the active surfaces $A_{200}$ of the dies 200 form a bonding surface BS.

After the dies 200 are pre-bonded onto the semiconductor wafer WS, a semiconductor workpiece WP is obtained. Thereafter, a first inspection process for inspecting the bonding surface BS of the semiconductor workpiece WP is performed. The first inspection process will be described below in conjunction with FIG. 2, FIG. 3A to FIG. 3E, FIG. 4A to FIG. 4E, FIG. 5A to FIG. 5B, and FIG. 6.

Figure 2:
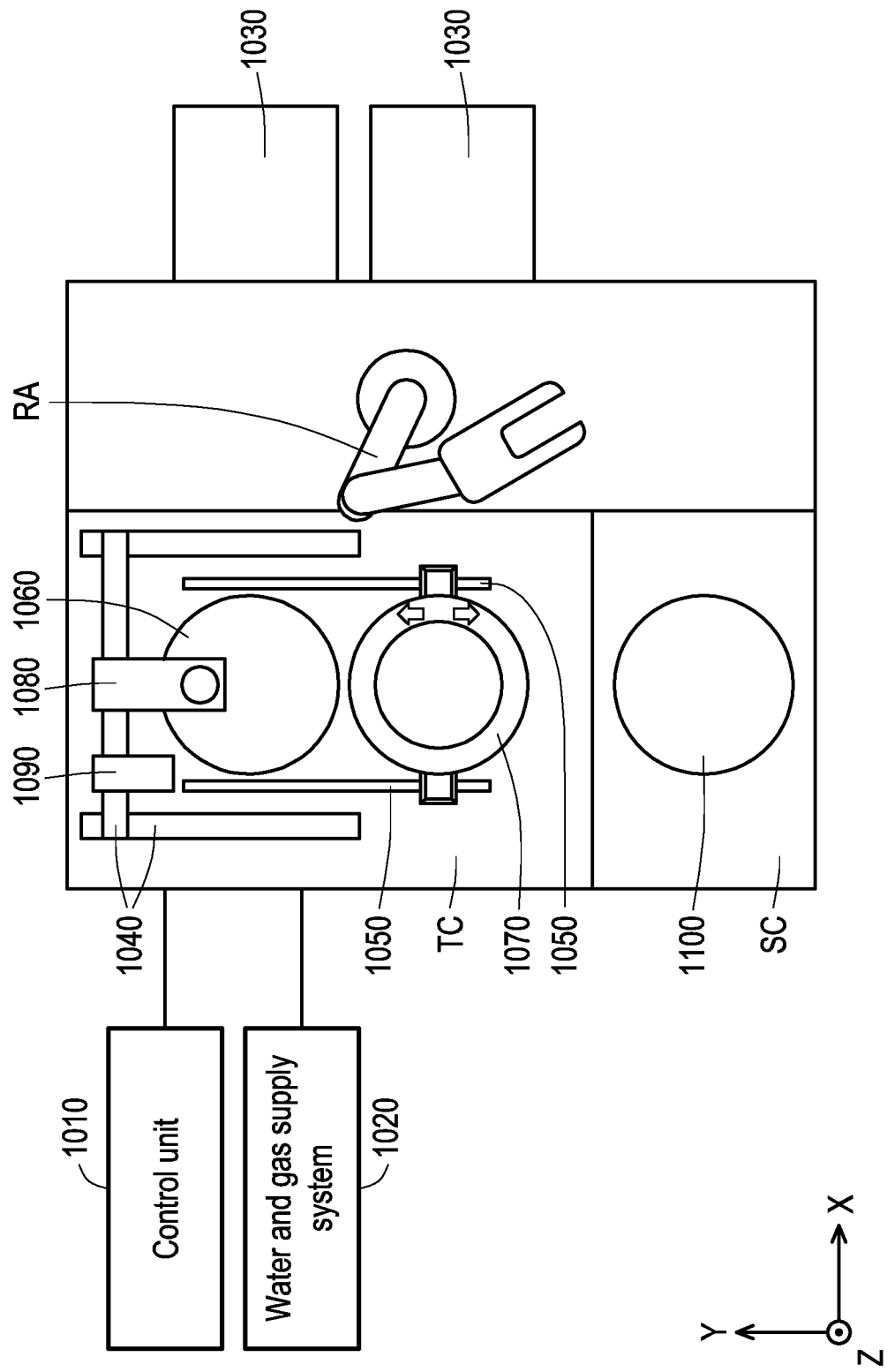
FIG. 2 is a schematic top view illustrating an inspection apparatus.

FIG. 2 is a schematic top view illustrating an inspection apparatus 1000. In some embodiments, the first inspection process for inspecting the bonding surface BS of the semiconductor workpiece WP in FIG. 1B is performed by the inspection apparatus 1000. Referring to FIG. 2, the inspection apparatus 1000 has a testing chamber TC and a spinning chamber SC adjacent to the testing chamber TC. In addition, the inspection apparatus 1000 includes a control unit 1010, a water and gas supply system 1020, a plurality of Front Opening Unified Pods (FOUP) 1030, a transducer guiding rail 1040, a pair of testing clamp guiding rail 1050, a testing stage 1060, a testing clamp 1070, a transducer 1080, a dryer 1090, a drying stage 1100, and a robotic arm RA. In some embodiments, the control unit 1010 is connected to the testing chamber TC for controlling the movement of the testing stage 1060, the testing clamp 1070, the transducer 1080, the dryer 1090, and the robotic arm RA. In some embodiments, the control unit 1010 is further connected to the spinning chamber to control the spinning speed of the drying stage 1100. In some embodiments, the control unit 1010 includes a processor or the like that is able to process signals received/transmitted by the control unit 1010. In some embodiments, the wafer and gas supply system 1020 is also connected to the testing chamber TC for providing water and gas utilized during the first inspection process.

In some embodiments, the FOUPs 1030 are configured to store the processed/unprocessed semiconductor workpieces WP. As illustrated in FIG. 2, the transducer guiding rail 1040, the pair of testing clamp guiding rail 1050, the testing stage 1060, the testing clamp 1070, the transducer 1080, and the dryer 1090 are located in the testing chamber TC. In some embodiments, the testing stage 1060 is configured to support/carry the semiconductor workpiece WP.

As illustrated in FIG. 2, the testing stage 1060 is located between the pair of testing clamp guiding rail 1050. On the other hand, the testing clamp 1070 is movably coupled to the testing clamp guiding rail 1050. For example, the testing clamp 1070 is able to perform reciprocate movement along a lengthwise direction of the testing clamp guiding rail 1050. Herein, the lengthwise direction of the testing clamp guiding rail 1050 is Y-direction. That is, the testing clamp 1070 is able to perform reciprocate movement along the Y-direction, as shown in FIG. 2. In some embodiments, the testing clamp 1070 is able to move to a position that is directly above the testing stage 1060, and is able to move along Z-direction to couple to the testing stage 1060. In other words, the testing clamp 1070 is movably coupled to the testing stage 1060.

In some embodiments, the transducer 1080 and the dryer 1090 are movably disposed above the testing stage 1060. For example, the transducer 1080 and the dryer 1090 are movably coupled to the testing clamp guiding rail 1040 to perform reciprocate movement along a lengthwise direction and a widthwise direction of the transducer guiding rail 1040. Herein, the lengthwise direction of the transducer guiding rail 1040 is Y-direction and the widthwise direction of the transducer guiding rail 1040 is X-direction. That is, the transducer 1080 and the dryer 1090 are able to perform reciprocate movement along both the Y-direction and the X-direction. In some embodiments, the testing clamp guiding rail 1040 includes a first rail extending along the X-direction and a pair of second rails extending along the Y-direction. The transducer 1080 and the dryer 1090 are coupled to the first rail to perform reciprocate movement along the X-direction. On the other hand, the first rail is coupled to the pair of second rails to perform reciprocate movement along the Y-direction. Since the transducer 1080 and the dryer 1090 are coupled to the first rail, the reciprocate movement along the Y-direction of the first rail also allows the transducer 1080 and the dryer 1090 to perform reciprocate movement along the Y-direction.

In some embodiments, the drying stage 1100 is located in the spinning chamber SC. For example, the drying stage 1100 is adjacent to the testing stage 1060. The drying stage 1100 is configured to spin dry the semiconductor workpiece WP. As illustrated in FIG. 2, the robotic arm RA is located between the FOUPs 1030 and the testing chamber TC. In some embodiments, the robotic arm RA is configured to transfer the semiconductor workpiece WP between the FOUPs 1030, the testing chamber TC, and the spinning chamber SC. In some embodiments, the inspection apparatus 1000 may perform "C mode scanning acoustic microscopy" or "Confocal Scanning Acoustic Microscopy (CSAM).

FIG. 3A to FIG. 3E are schematic top views illustrating an inspection apparatus 1000 during various stages of a first inspection process in accordance with some embodiments of the disclosure. FIG. 4A to FIG. 4E are schematic cross-sectional views illustrating the inspection apparatus 1000 during various stages of the first inspection process in FIG. 3A to FIG. 3E.

Figure 3A:
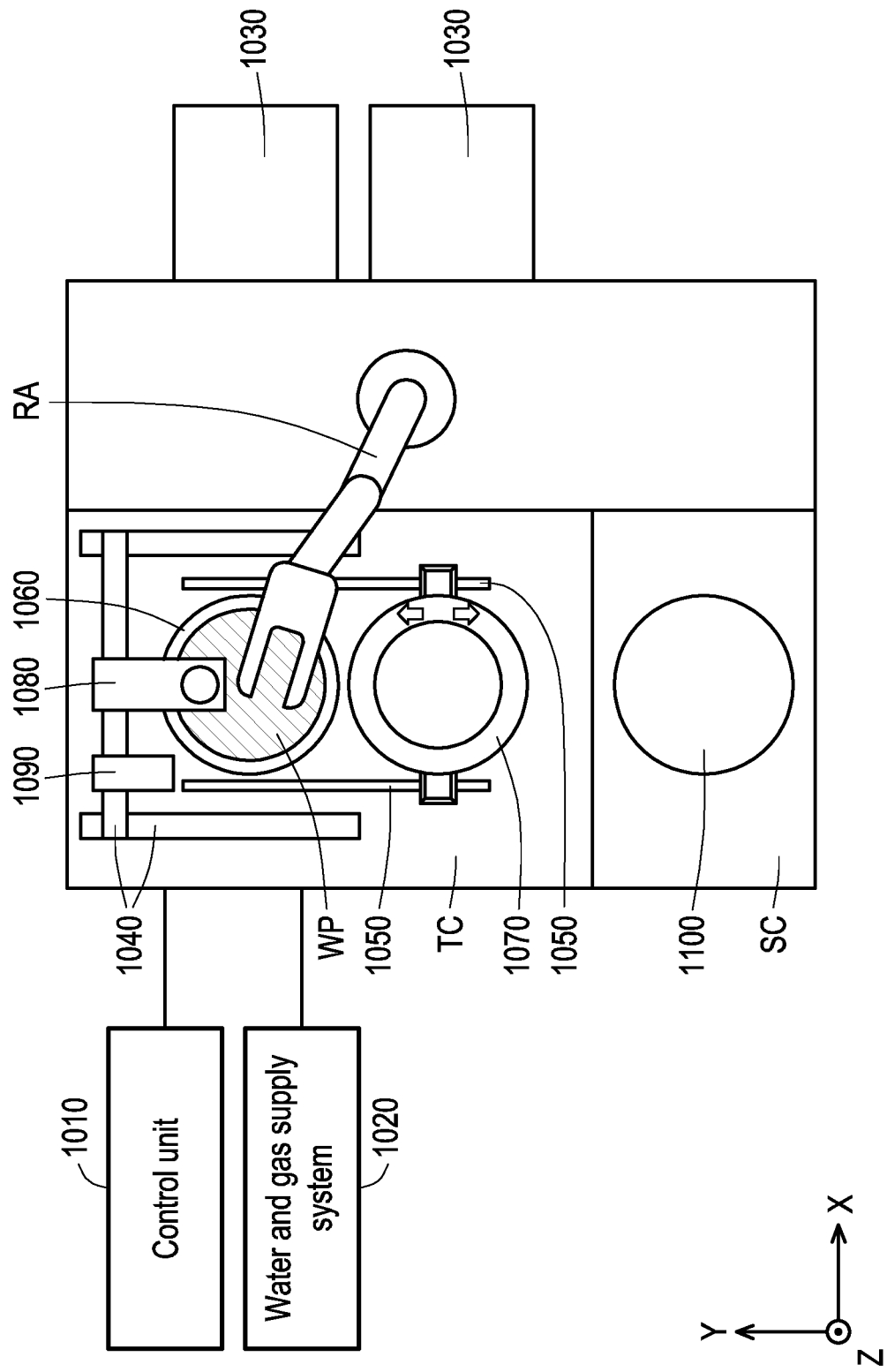
FIG. 3A to FIG. 3E are schematic top views illustrating an inspection apparatus during various stages of a first inspection process in accordance with some embodiments of the disclosure.
Figure 4A:
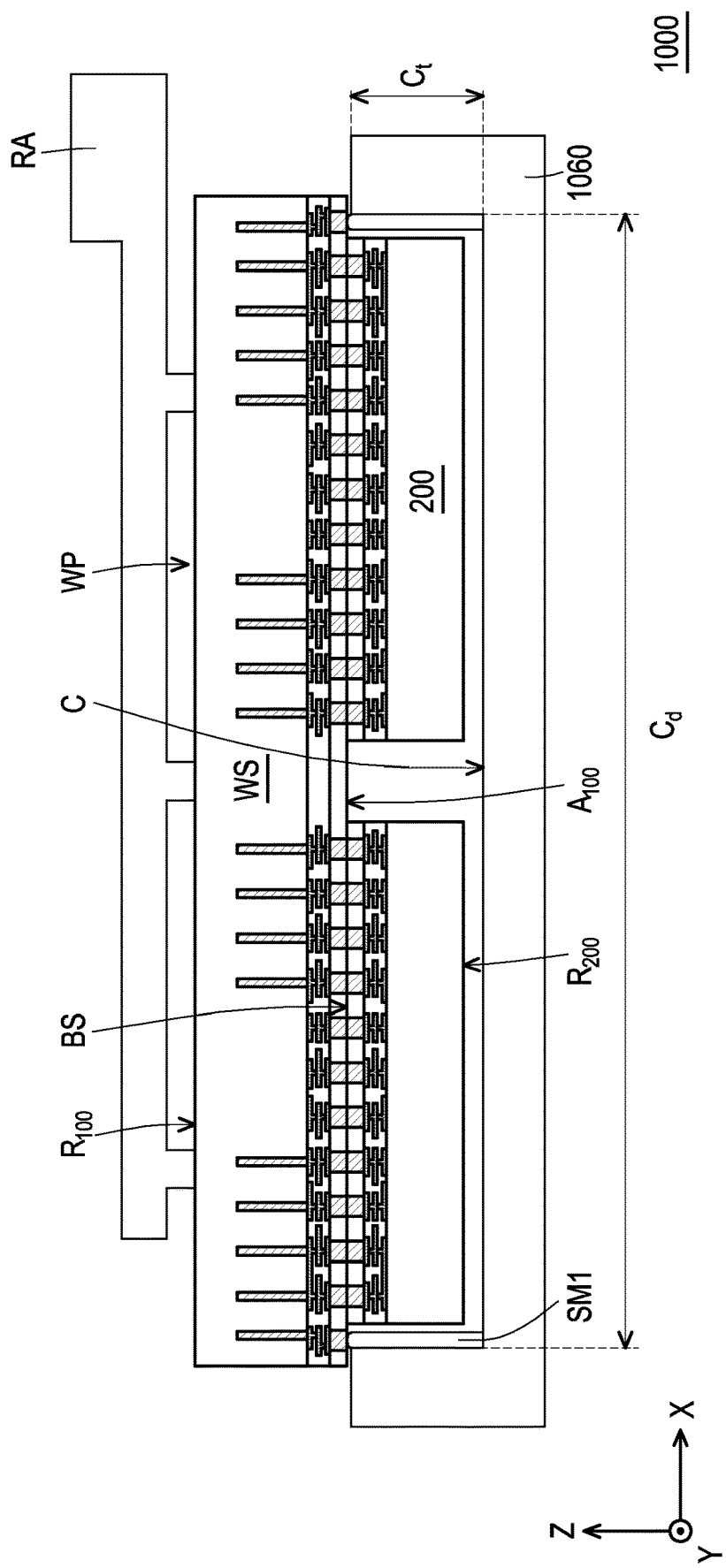
FIG. 4A to FIG. 4E are schematic cross-sectional views illustrating the inspection apparatus during various stages of the first inspection process in FIG. 3A to FIG. 3E.

Referring to FIG. 3A and FIG. 4A, the semiconductor workpiece WP is transferred from the FOUPs 1030 to the testing stage 1060 by the robotic arm RA. In some embodiments, the semiconductor workpiece WP is stored in the FOUPs 1030 with a face up manner. In other words, the semiconductor workpiece WP is stored in the FOUPs 1030 such that the rear surface $R_{200}$ of the dies 200 face upward. In some embodiments, the robotic arm RA is attached to the rear surface $R_{100}$ of the semiconductor wafer WS. Before the semiconductor workpiece WP is placed on the testing stage 1060, the robotic arm RA rotates 180° to flip the semiconductor workpiece WP. For example, as illustrated in FIG. 4A, the rear surface $R_{200}$ of the dies 200 face downward. After the semiconductor workpiece WP is flipped by the robotic arm RA, the semiconductor workpiece WP is placed on the testing stage 1060.

In some embodiments, the testing stage 1060 has a cavity C. In some embodiments, the cavity C has a circular shape from a top view. In some embodiments, a depth Ct of the cavity C ranges from about 50 μm to about 2000 μm. On the other hand, a diameter Ca of the cavity C ranges from about 280 mm to about 299.5 mm. In some embodiments, the inspection apparatus 1000 further includes a first seal member SM1 disposed in the cavity C. In some embodiments, the first seal member SM1 is attached to a sidewall of the cavity C, as illustrated in FIG. 3A. Since the cavity C has a circular shape from the top view and the first seal member SM1 is attached to the sidewall of the cavity C, the first seal member SM1 exhibits a circular ring shape from the top view. In some embodiments, the first seal member SM1 is made of rubbers or resins. For example, the first seal member SM1 is an O-ring.

In some embodiments, the semiconductor workpiece WP is transferred to the testing stage 1060 such that the semiconductor wafer WS is placed on the first seal member SM1. For example, the active surface $A_{100}$ of the semiconductor wafer WS is in physical contact with the first seal member SM1. Meanwhile, the dies 200 are placed in the cavity C. As mentioned above, the semiconductor workpiece WP is placed in a face down manner, so the rear surfaces $R_{200}$ of the dies 200 face the cavity C. However, the rear surface $R_{200}$ of the dies 200 are spaced apart from a bottom surface of the cavity C. In other words, the dies 200 are not in contact with the testing stage 1060.

Figure 3B:
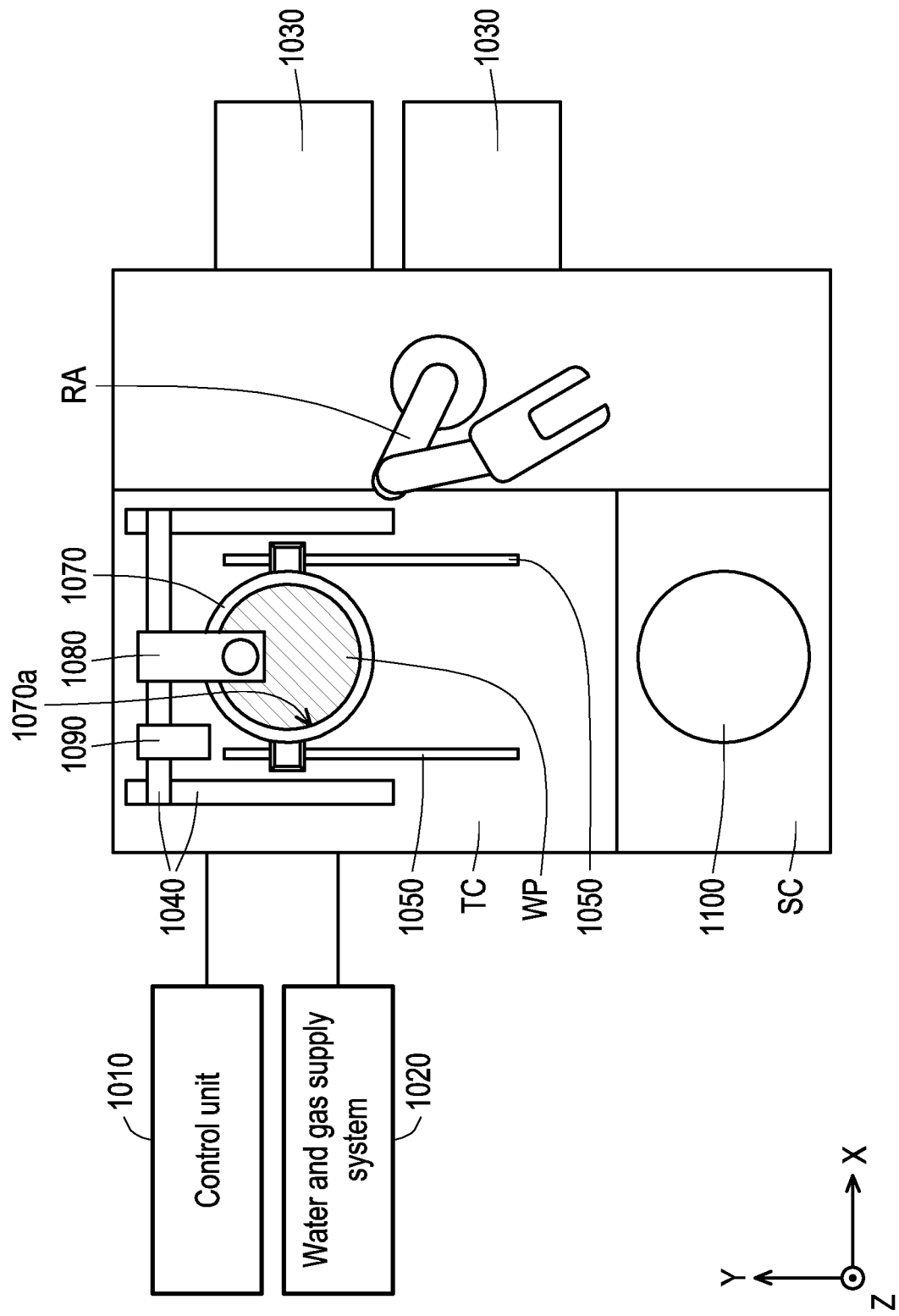
Figure 4B:
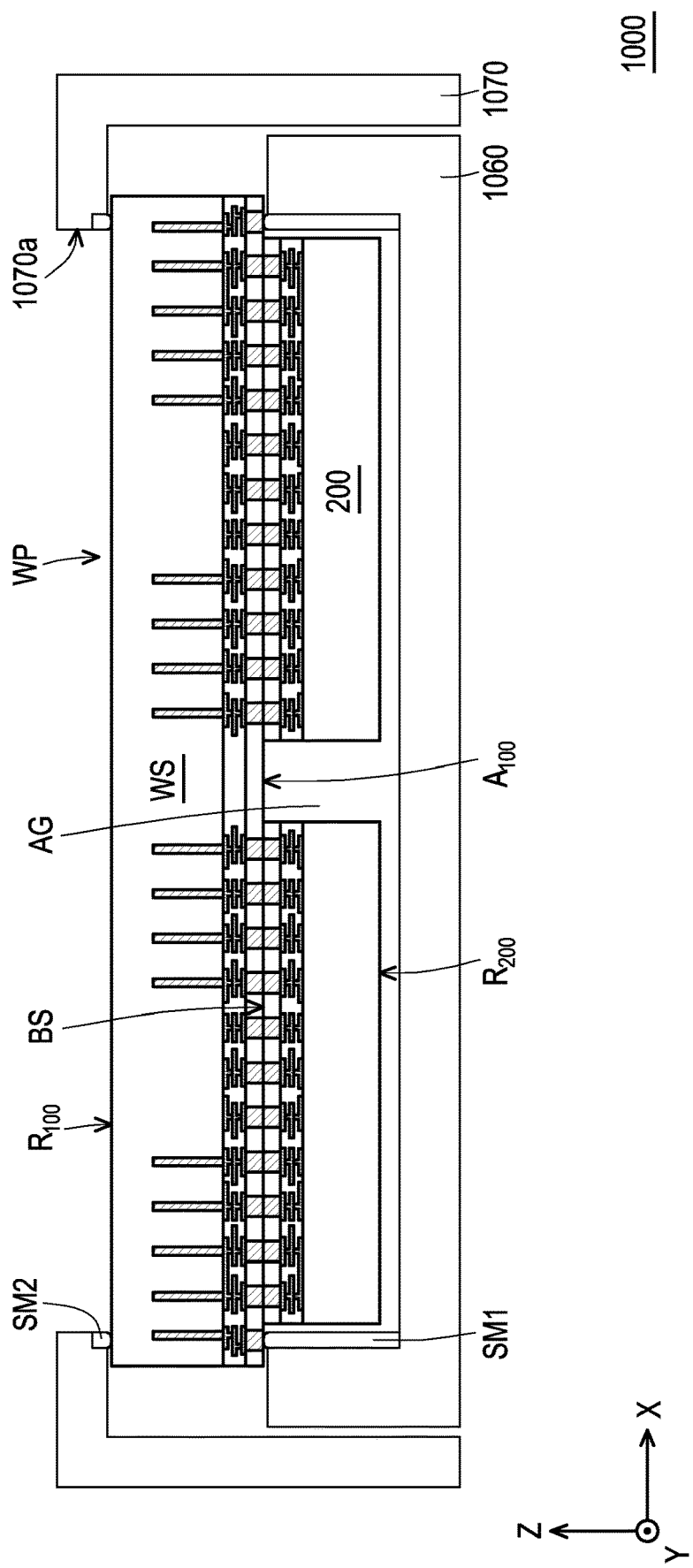

Referring to FIG. 3B and FIG. 4B, after the semiconductor workpiece WP is placed on the testing stage 1060, the testing clamp 1070 moves along the Y-direction to a position that is directly above the testing stage 1060. Thereafter, the testing clamp 1070 clamps the semiconductor workpiece WP onto the testing stage 1060. In other words, the testing clamp 1070 securely fixes the semiconductor workpiece WP onto the testing stage 1060. In some embodiments, the inspection apparatus 1000 further includes a second seal member SM2. As illustrated in FIG. 4B, the second seal member SM2 is attached to the testing clamp 1070. In some embodiments, the second seal member SM2 is made of rubbers or resins. For example, the second seal member SM2 is an O-ring. In some embodiments, the semiconductor workpiece WP is clamped onto the testing stage 1060 such that the semiconductor wafer WS of the semiconductor workpiece WP is fixed between the first seal member SM1 and the second seal member SM2. For example, the active surface $A_{100}$ of the semiconductor wafer WS is in contact with the first seal member SM1, and the rear surface $R_{100}$ of the semiconductor wafer WS is in contact with the second seal member SM2. In other words, the semiconductor workpiece WP is held between the testing stage 1060 and the testing clamp 1070 by the first seal member SM1 and the second seal member SM2. The clamping mechanism will be described below in conjunction with FIG. 5A and FIG. 5B.

Figure 5A:
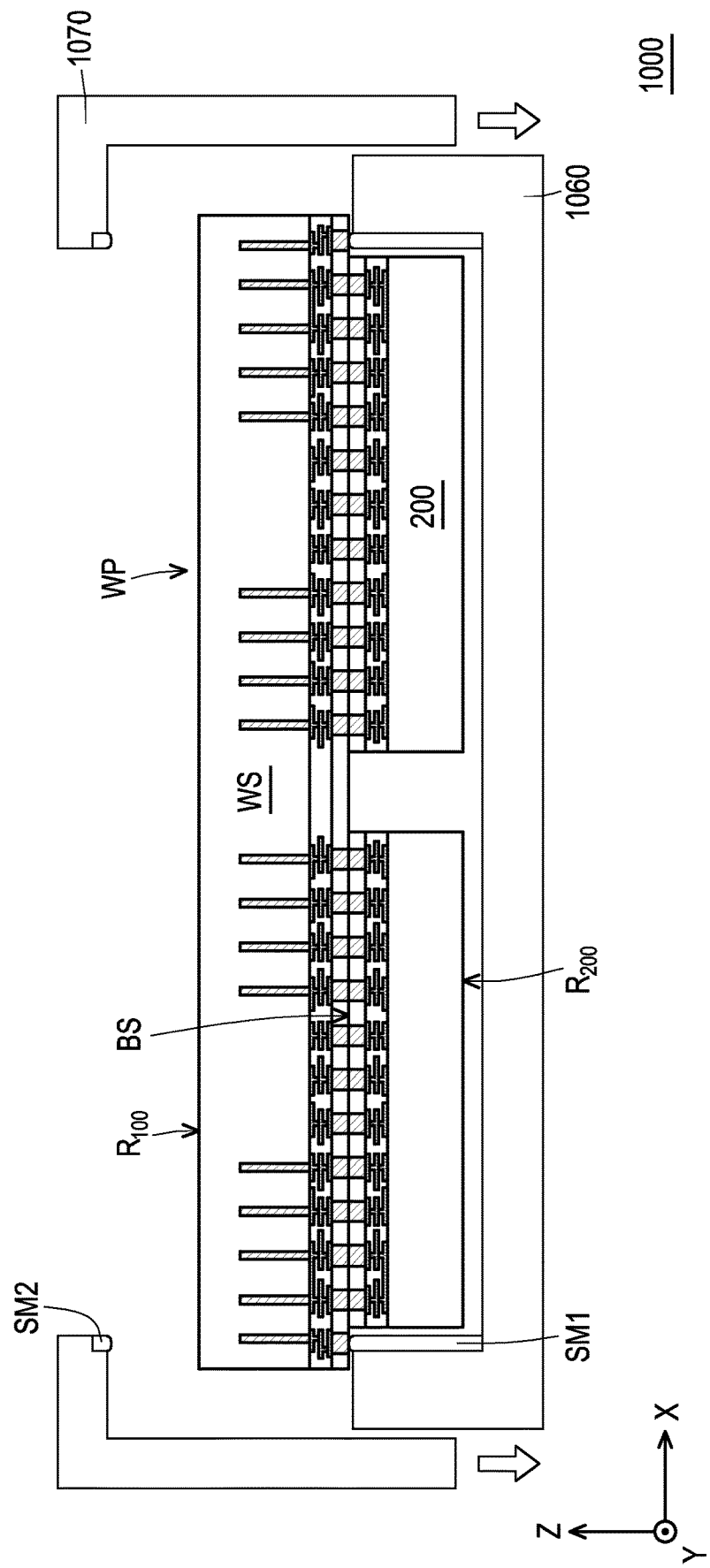
FIG. 5A and FIG. 5B are schematic cross-sectional views respectively illustrating an inspection apparatus during a stage of the first inspection process in accordance with some embodiments of the disclosure.
Figure 5B:
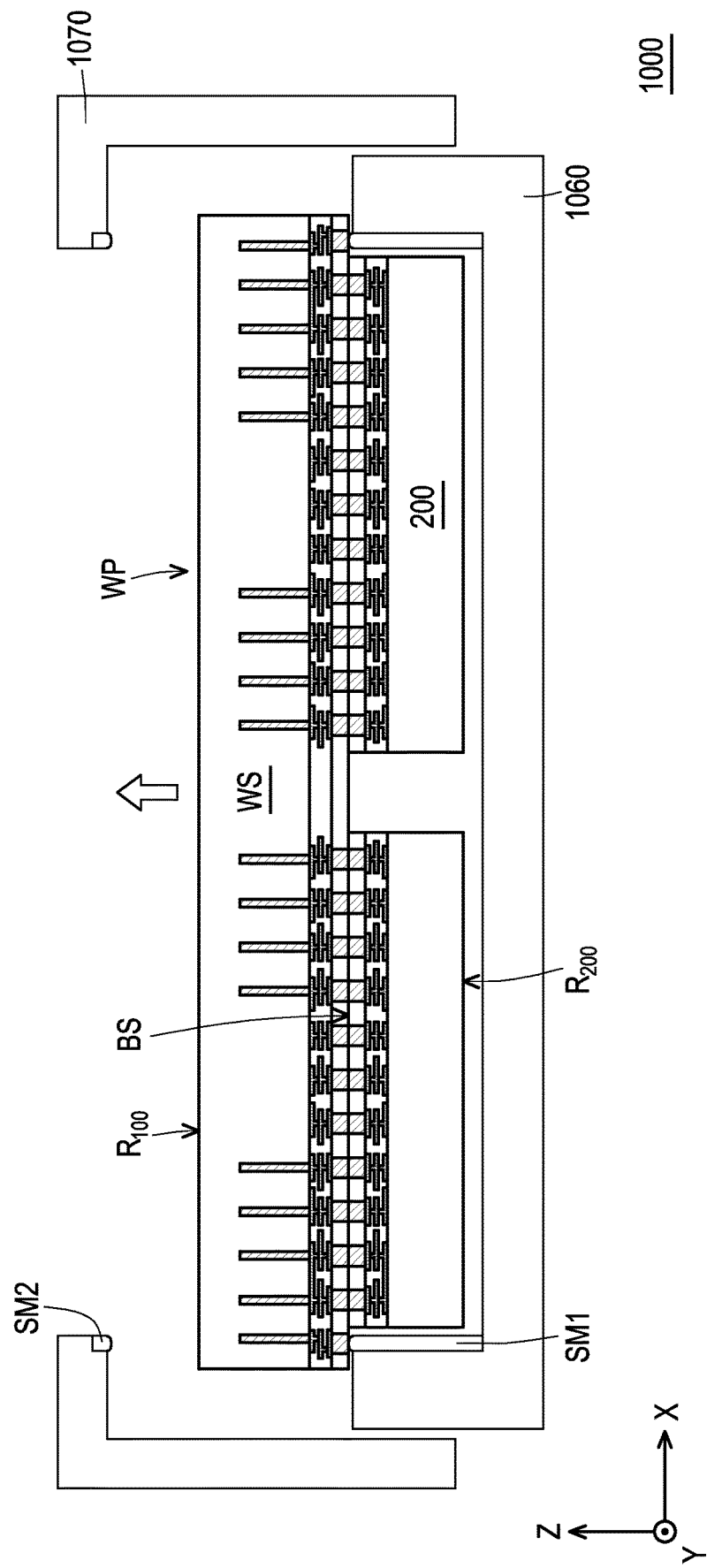

FIG. 5A to FIG. 5B are schematic cross-sectional views respectively illustrating an inspection apparatus 1000 during a stage of the first inspection process in accordance with some embodiments of the disclosure. Referring to FIG. 5A, in some embodiments, after the testing clamp 1070 moves along the Y-direction to a position that is directly above the testing stage 1060, the testing clamp 1070 further moves down along the Z-direction (as denoted by the arrow) to securely fix the semiconductor workpiece WP between the testing stage 1060 and the testing clamp 1070. Meanwhile, the testing stage 1060 remain fixed. However, the disclosure is not limited thereto. Referring to FIG. 5B, in some alternative embodiments, after the testing clamp 1070 moves along the Y-direction to a position that is directly above the testing stage 1060, the testing stage 1060 moves up along the Z-direction (as denoted by the arrow) to securely fix the semiconductor workpiece WP between the testing stage 1060 and the testing clamp 1070. Meanwhile, the testing clamp 1070 remain fixed.

Referring back to FIG. 4B, the first seal member SM1 extends along an edge of the active surface $A_{100}$ of the semiconductor wafer WS. On the other hand, the second seal member SM2 extends along an edge of the rear surface $R_{100}$ of the semiconductor wafer WS. In other words, the first seal member SM1 and the second seal member SM2 respectively exhibits a circular ring shape from the top view.

In some embodiments, after the semiconductor workpiece WP (i.e. the semiconductor wafer WS and the dies 200) is clamp onto the testing stage 1060, an air gap AG is formed between the semiconductor wafer WS and the testing stage 1060. In other words, the dies 200 are sealed between the semiconductor wafer WS and the testing stage 1060 and are surrounded by the air gap AG. As illustrated in FIG. 3B and FIG. 4B, the testing clamp 1070 has an opening 1070a exposing the semiconductor workpiece WP. For example, the opening 1070a of the testing clamp 1070 exposes the rear surface $R_{100}$ of the semiconductor wafer WS.

Figure 3C:
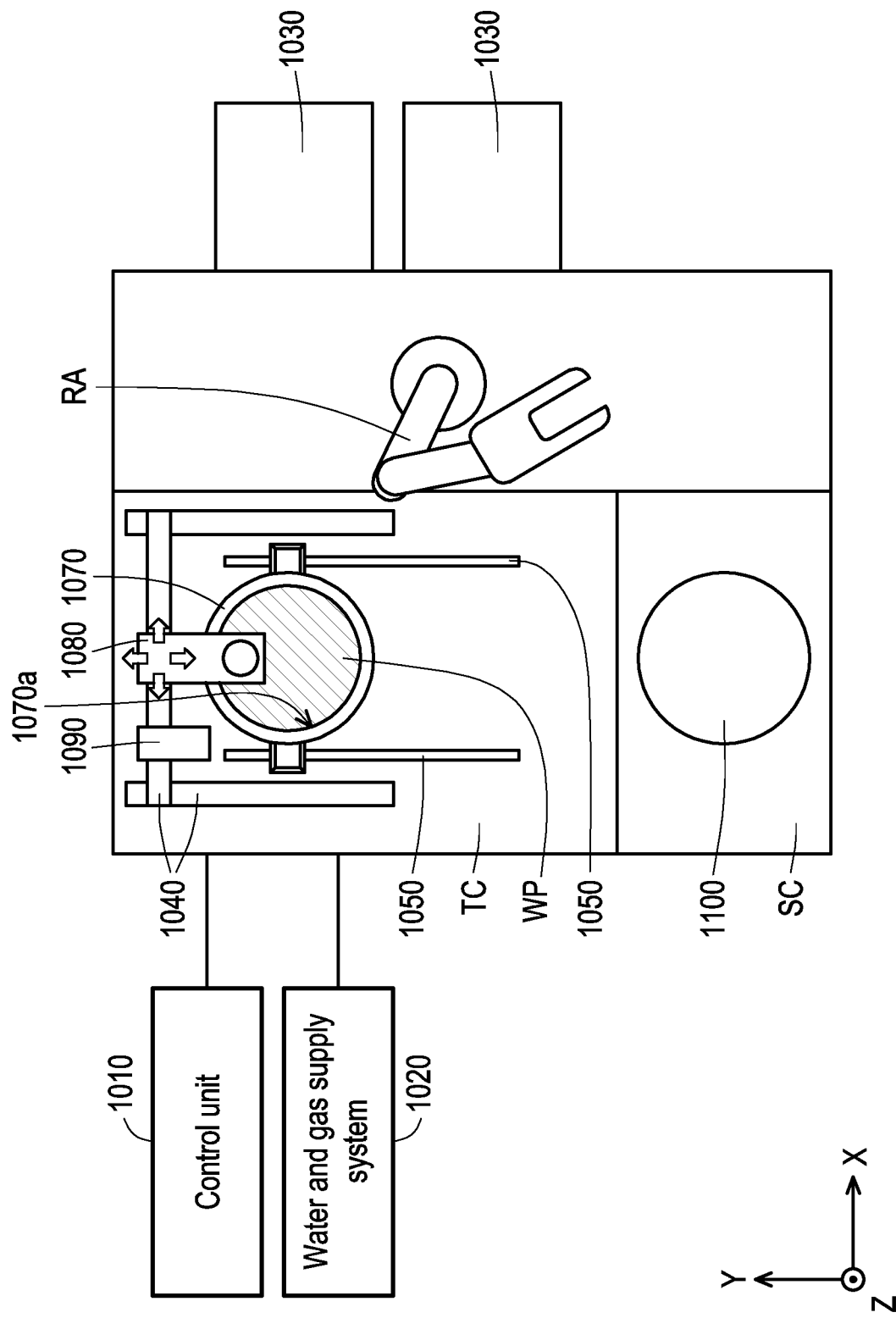
Figure 4C:
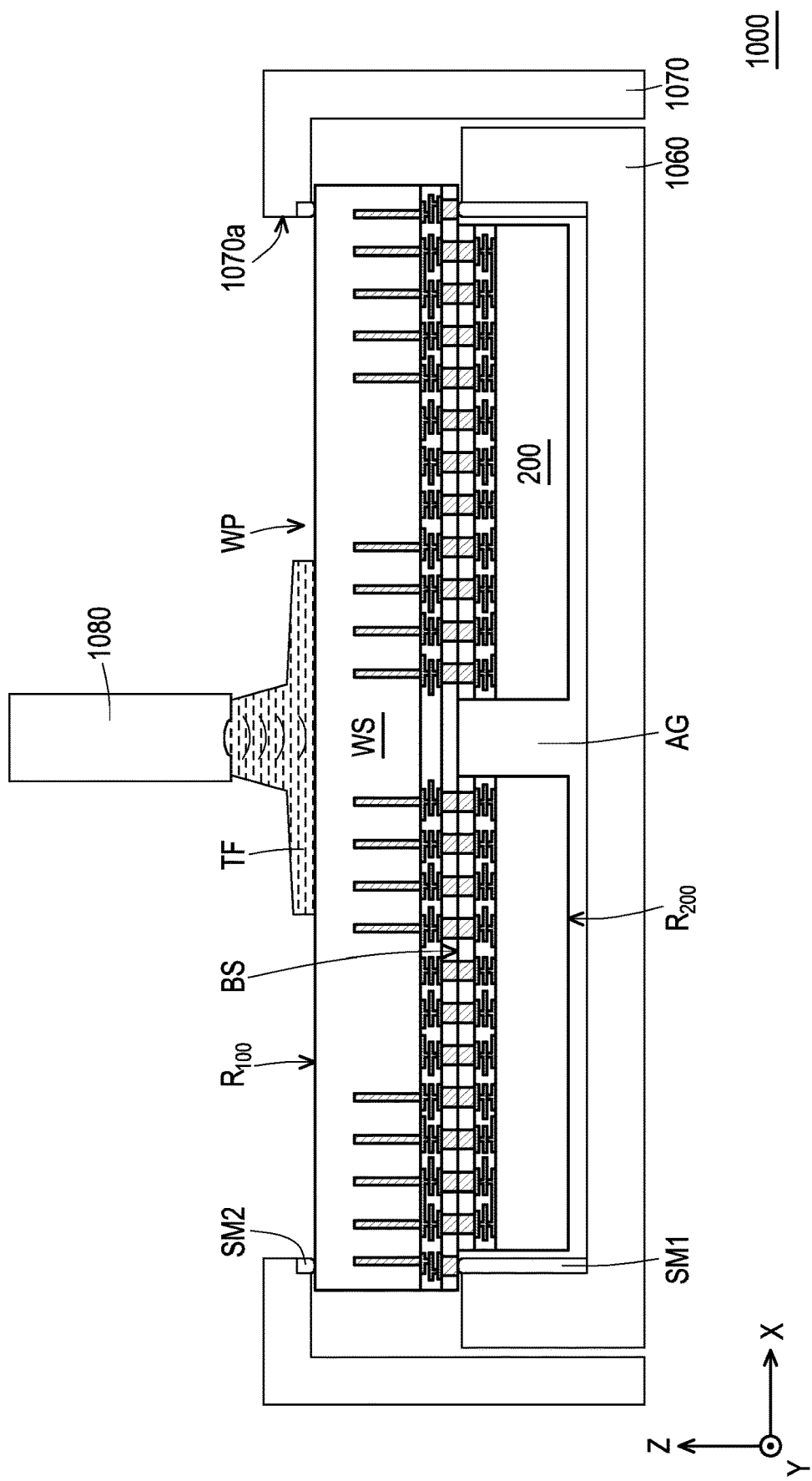

Referring to FIG. 3C and FIG. 4C, after the semiconductor workpiece WP is clamped onto the testing stage 1060, the bonding surface BS between the dies 200 and the semiconductor wafer WS of the semiconductor workpiece WP is inspected by the transducer 1080. In some embodiments, the transducer 1080 is coupled to the transducer guiding rail 1040 to move along the X-direction and the Y-direction, so as to scan the semiconductor workpiece WP exposed by the opening 1070a of the testing clamp 1070. In some embodiments, the transducer 1080 is able to emit/receive ultrasonic waves. By analyzing the ultrasonic waves emitted and received, the quality of the bonding surface BS of the semiconductor workpiece WP may be evaluated. For example, defects of the bonding surface BS of the semiconductor workpiece WP may be detected by the transducer 1080. In some embodiments, since the dies 200 are pre-bonded to the semiconductor wafer WS, if defects are detected during this stage, it is possible to easily strip the die 200 with defected bonding surface BS off from the semiconductor wafer WS and rework the pre-bonding process. As such, the yield rate of the subsequently formed integrated circuit IC may be sufficiently increased, and the quality of the subsequently formed integrated circuit IC may be ensured.

In some embodiments, in order to facilitate the accuracy of the ultrasonic wave emitted/received, a medium may be provided between the transducer 1080 and the semiconductor workpiece WP. For example, as illustrated in FIG. 4C, a testing fluid TF is provided between the transducer 1080 and the semiconductor workpiece WP while the bonding surface BS of the semiconductor workpiece WP is being inspected by the transducer 1080. That is, the testing fluid TF is provided between the transducer 1080 and the rear surface $R_{100}$ of the semiconductor wafer WS. In some embodiments, the testing fluid TF is ejected by the transducer 1080 while the transducer 1080 is scanning the semiconductor workpiece WP. In some embodiments, the testing fluid TF includes water. However, the disclosure is not limited thereto. In some alternative embodiments, other suitable fluids may be utilized as the testing fluid TF. As illustrated in FIG. 4C, since the semiconductor workpiece WP is placed in a face down manner, the bonding surface BS of the semiconductor workpiece WP is being sealed by the first seal member SM1 and the semiconductor wafer WS. In other words, the testing fluid TF would stay on the rear surface $R_{100}$ of the semiconductor wafer WS without permeating into the bonding surface BS of the semiconductor workpiece WP. As such, the conventional problem of testing fluid TF permeation into the bonding surface BS to break the bonding between the dies 200 and the semiconductor wafer WS may be sufficiently prevented, and the yield of the subsequently formed integrated circuit IC may be increased.

Figure 3D:
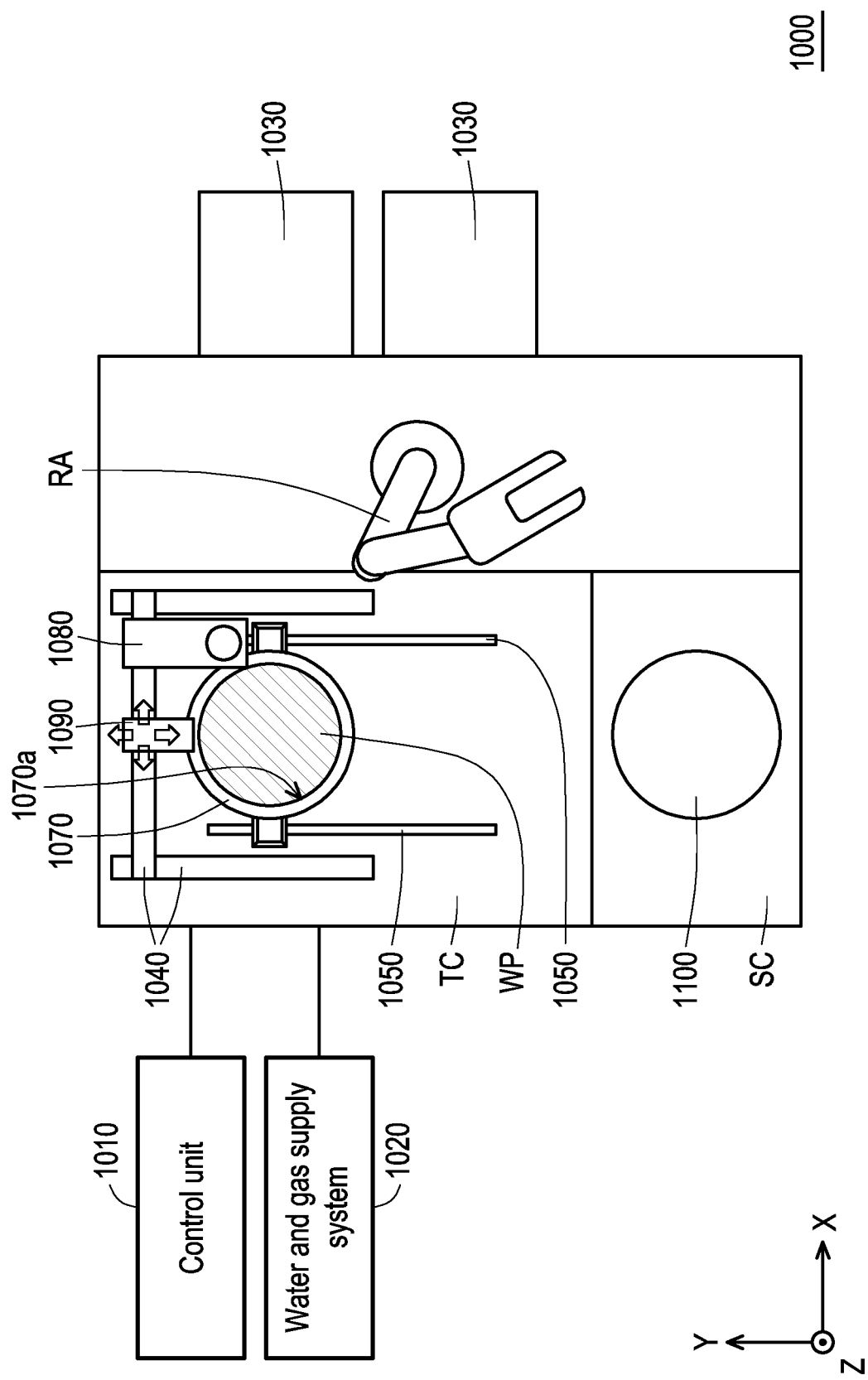
Figure 4D:
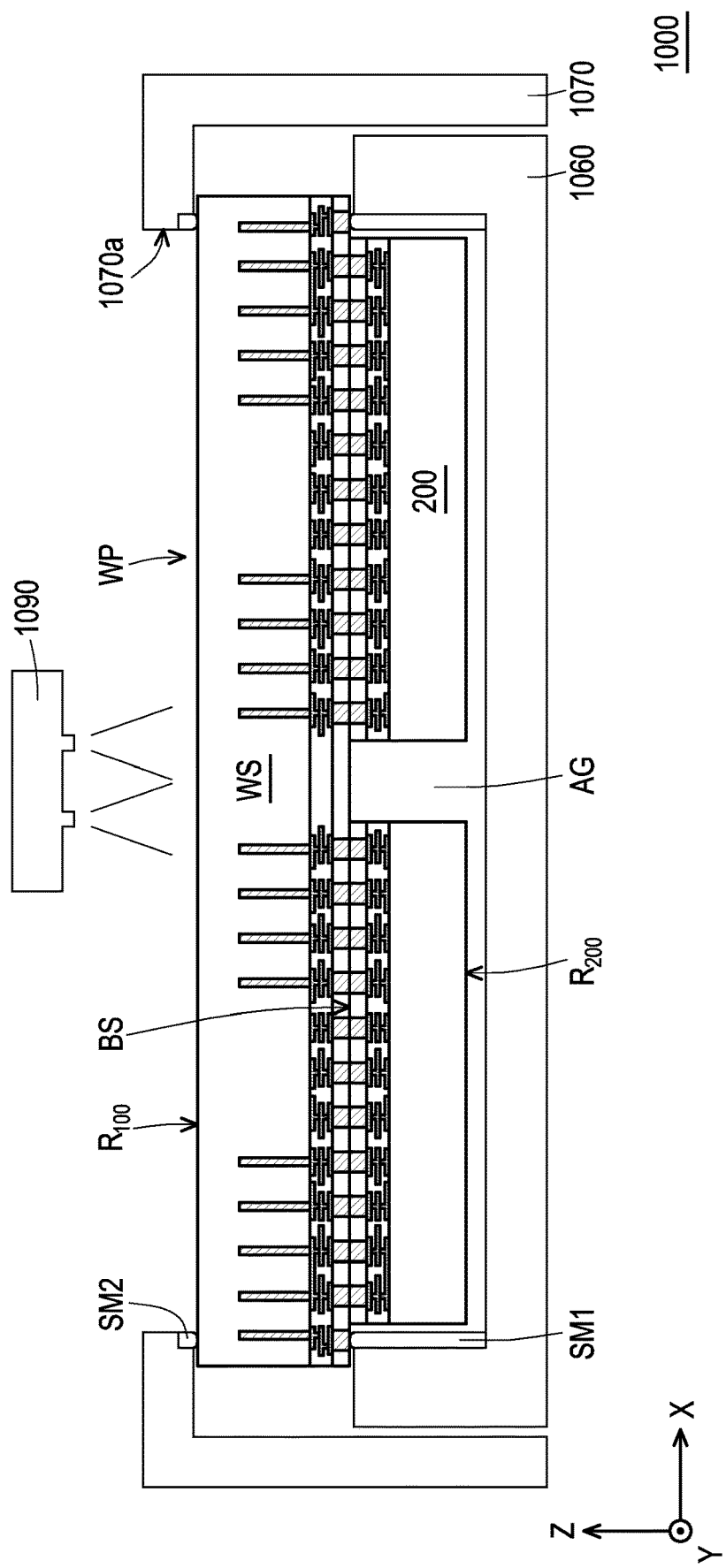

Referring to FIG. 3D and FIG. 4D, after the bonding surface BS of the semiconductor workpiece WP is inspected by the transducer 1080, the testing fluid TF is removed. For example, without moving the semiconductor workpiece WP (i.e. allowing the semiconductor wafer WS and the dies 200 to be still clamped on the testing stage 1060), the rear surface $R_{100}$ of the semiconductor wafer WS may be dried by the dryer 1090. In some embodiments, the dryer 1090 is coupled to the transducer guiding rail 1040 to move along the X-direction and the Y-direction, so as to dry the semiconductor workpiece WP. In some embodiments, the dryer 1090 includes a blow dryer which blows air to dry the semiconductor workpiece WP. In some embodiments, the dryer 1090 blows hot air on the rear surface $R_{100}$ of the semiconductor wafer WS to evaporate the testing fluid TF. Similar to that of the transducer 1080, the dryer 1090 also scans the semiconductor workpiece WP exposed by the opening 1070a of the testing clamp 1070 to dry the semiconductor workpiece WP.

Figure 3E:
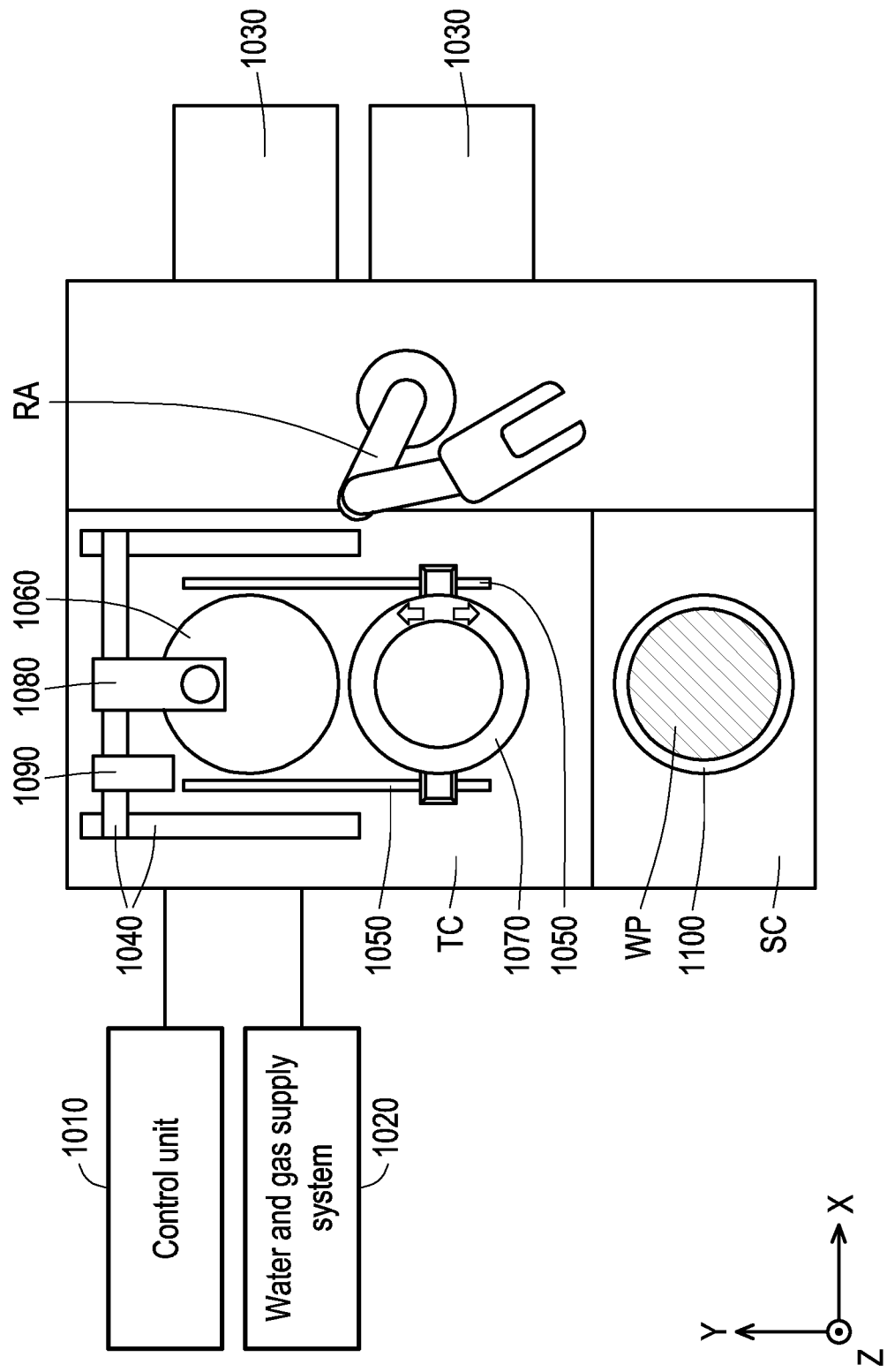
Figure 4E:
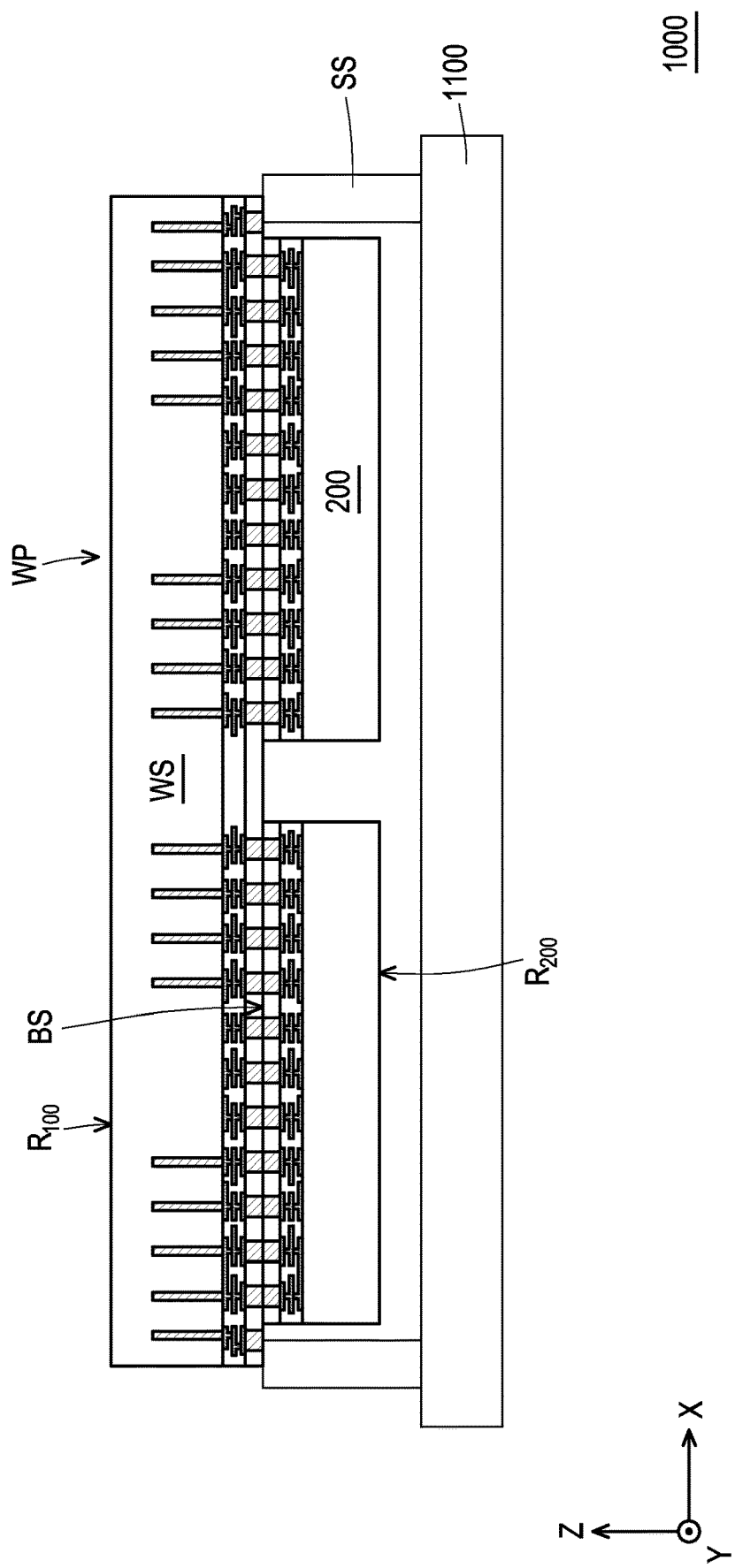

Referring to FIG. 3E and FIG. 4E, after blow drying the rear surface $R_{100}$ of the semiconductor wafer WS, the semiconductor workpiece WP is released from the testing clamp 1070 and is transferred to the drying stage 1100. After the semiconductor workpiece WP is placed onto the drying stage 1100, the semiconductor workpiece WP (i.e. the semiconductor wafer WS and the dies 200) is further dried by spin drying. As illustrated in FIG. 4E, the semiconductor workpiece WP is supported by a supporting structure SS such that the rear surfaces $R_{200}$ of the dies 200 are spaced apart from the drying stage 1100. However, the disclosure is not limited thereto. In some alternative embodiments, the rear surfaces $R_{200}$ of the dies 200 may be in physical contact with the drying stage 1100, and the supporting structure SS may be omitted. In some embodiments, the step shown in FIG. 3E and FIG. 4E may be optional. For example, if the testing fluid TF is being sufficiently removed in the step shown in FIG. 3D and FIG. 4D, the spin drying step shown in FIG. 3E and FIG. 4E may be omitted.

Figure 6:
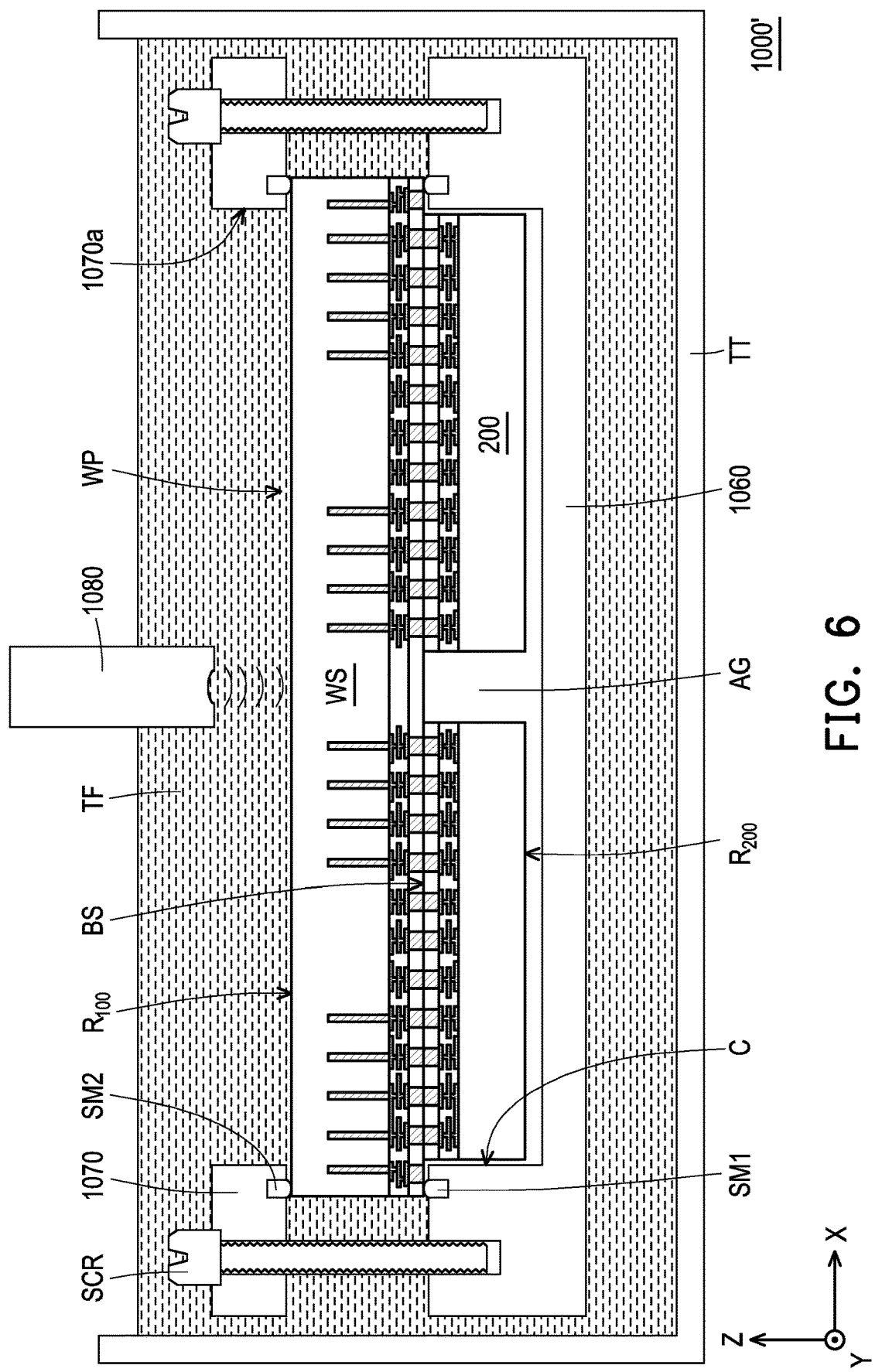
FIG. 6 is a schematic cross-sectional view illustrating an inspection apparatus during a stage of the first inspection process in accordance with some alternative embodiments of the disclosure.

After the semiconductor workpiece WP is being inspected and dried, the first inspection process is substantially completed. It should be noted that the first inspection process shown in FIG. 3A to FIG. 3E and FIG. 4A to FIG. 4E is performed by the inspection apparatus 1000. However, the disclosure is not limited thereto. In some alternative embodiments, the first inspection process may be performed by an inspection apparatus 1000' shown in FIG. 6. FIG. 6 is a schematic cross-sectional view illustrating an inspection apparatus 1000' during a stage of the first inspection process in accordance with some alternative embodiments of the disclosure.

Referring to FIG. 6, the inspection apparatus 1000' is similar to the inspection apparatus 1000 in FIG. 3A to FIG. 3E and FIG. 4A to FIG. 4E, so similar elements are denoted by the same reference numeral and the detailed descriptions thereof are omitted herein. In some embodiments, the inspection apparatus 1000' further includes a testing tank TT and a plurality of fasteners SCR. In some embodiments, the testing tank TT is configured to accommodate the testing fluid TF, the testing stage 1060, and the testing clamp 1070.

On the other hand, the fasteners SCR are configured to detachably fastening the testing clamp 1070 onto the testing stage 1060.

In some embodiments, the first inspection process utilizing the inspection apparatus 1000' is started with transferring the semiconductor workpiece WP onto the testing stage 1060 (i.e. similar to the step shown in FIG. 3A and FIG. 4A). It should be noted that during this stage, the testing stage 1060 and the semiconductor workpiece WP are located within the testing tank TT. Thereafter, the semiconductor workpiece WP is clamped onto the testing stage 1060 by the testing clamp 1070. It should be noted that during this stage, the testing clamp 1070 is also located within the testing tank TT. In some embodiments, after the testing clamp 1070 holds the semiconductor workpiece WP in place, the fasteners SCR are provided to further fix the testing stage 1060, the semiconductor workpiece WP, and the testing clamp 1070 in place. In some embodiments, the fasteners SCR penetrate through the testing clamp 1070 and extend into the testing stage 1060 to ensure the steadiness of the testing stage 1060 and the testing clamp 1070. In other words, after the semiconductor workpiece WP (i.e. the semiconductor wafer WS and the dies 200) are clamped onto the testing stage 1060 by the testing clamp 1070, the testing clamp 1070 is securely fixed onto the testing stage 1060 through the fasteners SCR. In some embodiments, the fasteners SCR include screws or the like. By securely fixing the testing clamp 1070 onto the testing stage 1060, an air gap AG is formed between the semiconductor wafer WS and the testing stage 1060. Meanwhile, the dies 200 are sealed between the semiconductor wafer WS and the testing stage 1060 and are surrounded by the air gap AG. In other words, the bonding surface BS of the semiconductor workpiece WP is sealed by the semiconductor wafer WS and the testing stage 1060. After ensuring the bonding surface BS is being sealed, the testing tank TT is filled with the testing fluid TF. As illustrated in FIG. 6, the testing fluid TF is being blocked by the semiconductor wafer WS, the first seal member SM1, and the testing stage 1060, so the testing fluid TF does not permeate into the air gap AG. Please be noted that although FIG. 6 illustrated that the first seal member SM1 is outside of the cavity C of the testing stage 1060, the disclosure is not limited thereto. In some alternative embodiments, the first seal member SM1 in the inspection apparatus 1000' may be attached to the sidewall of the cavity C (i.e. similar to the configuration shown in FIG. 3B). As such, the conventional problem of testing fluid TF permeation into the bonding surface BS to break the bonding between the dies 200 and the semiconductor wafer WS may be sufficiently prevented, and the yield of the subsequently formed integrated circuit IC may be increased.

Then, as illustrated in FIG. 6, the bonding surface BS between the dies 200 and the semiconductor wafer WS of the semiconductor workpiece WP is inspected by the transducer 1080. Unlike the step shown in FIG. 4C in which the transducer 1080 ejects testing fluid TF, in FIG. 6, the testing fluid TF is already presented in the testing tank TT. Through analyzing the ultrasonic waves emitted and received by the transducer 1080, the quality of the bonding surface BS of the semiconductor workpiece WP may be evaluated. For example, defects of the bonding surface BS of the semiconductor workpiece WP may be detected by the transducer 1080. In some embodiments, since the dies 200 are pre-bonded to the semiconductor wafer WS, if defects are detected during this stage, it is possible to easily strip the die 200 with defected bonding surface BS off from the semiconductor wafer WS and rework the pre-bonding process. As such, the yield rate of the subsequently formed integrated circuit IC may be sufficiently increased, and the quality of the subsequently formed integrated circuit IC may be ensured.

After the bonding surface BS of the semiconductor workpiece WP is inspected by the transducer 1080, the testing fluid TF is removed. For example, the testing fluid TF may be drained from the testing tank TT. However, residues of the testing fluid TF may remain on the rear surface $R_{100}$ of the semiconductor wafer WS. As such, the steps shown in FIG. 3D to FIG. 3E and FIG. 4D to FIG. 4E may be performed to dry the semiconductor workpiece WP, and the first inspection process is substantially completed.

After the first inspection process is completed and the quality of the bonding surface BS of the semiconductor workpiece WP is ensured, the manufacturing process of the integrated circuit IC may be resumed.

Figure 1C:
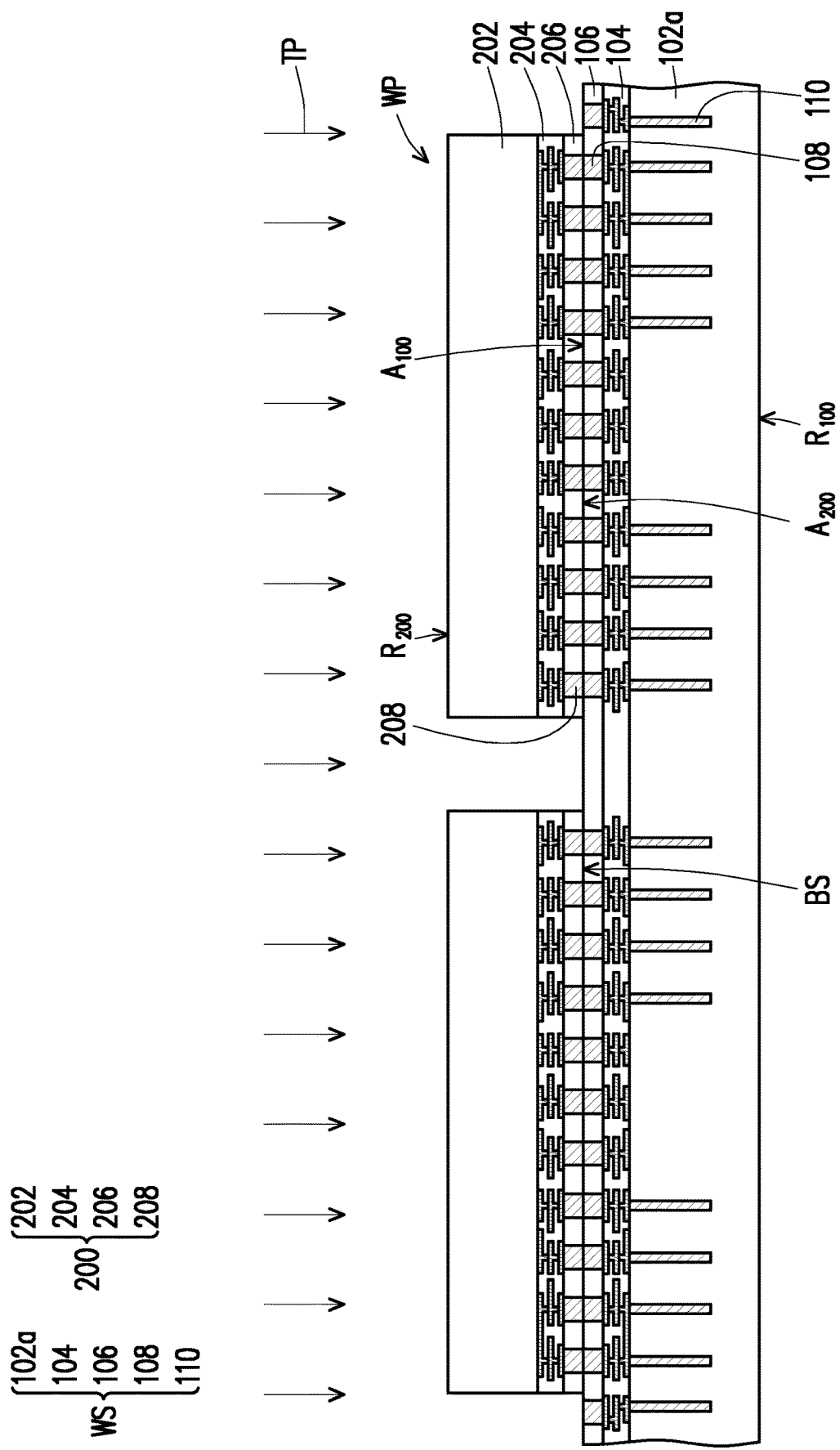

Referring to FIG. 1C, after pre-bonding the dies 200 onto the semiconductor wafer WS, SoIC bonding of the semiconductor wafer WS and the dies 200 is performed. The SoIC bonding of the semiconductor wafer WS and the dies 200 includes performing a thermal process TP on the dies 200 and the semiconductor wafer WS after the first inspection process, so as to securely bond the dies 200 onto the semiconductor wafer WS. In some embodiments, a hybrid bonding may be applied. For example, the thermal process TP includes a thermal treatment for dielectric bonding and a thermal annealing for conductor bonding. In some embodiments, the thermal treatment for dielectric bonding is performed to strengthen the bonding between the dielectric layers 106, 206. For example, the thermal treatment for dielectric bonding may be performed at temperature ranging from about 100 Celsius degree to about 150 Celsius degree. After performing the thermal treatment for dielectric bonding, the thermal annealing for conductor bonding is performed to facilitate the bonding between the conductors 108, 208. For example, the thermal annealing for conductor bonding may be performed at temperature ranging from about 300 Celsius degree to about 400 Celsius degree. The process temperature of the thermal annealing for conductor bonding is higher than that of the thermal treatment for dielectric bonding. After performing the thermal annealing for conductor bonding, the dielectric layer 106 is bonded to the dielectric layer 206 and the conductors 108 are bonded to the conductors 208. In some embodiments, the conductors 108 of the semiconductor wafer WS and the conductors 208 of the dies 200 may respectively be conductive vias (e.g., copper vias), conductive pads (e.g., copper pads), or combinations thereof. For example, the conductor bonding between the conductors 108, 208 may be via-to-via bonding, pad-to-pad bonding, or via-to-pad bonding. In some embodiments, sidewalls of the conductors 108 are aligned with sidewalls of the conductors 208.

In some embodiments, not all of the conductors 108 are being bonded to the corresponding conductor 208. For example, as shown in FIG. 1C, some conductors 108 are not bonded to the dies 200 and are being exposed by the dies 200. These conductors 108 may serve as dummy conductors 108 and do not contribute to electrical conduction or signal transmission in the subsequently formed semiconductor device. In other words, these conductors 108 are electrically floating.

It should be noted that although the bonding surface BS in FIG. 1B and FIG. 1C is formed through a hybrid bonding process as an example for SoIC bonding process, the disclosure is not limited thereto. In some alternative embodiments, the bonding surface BS may be formed by metal-tometal bonding, polymer-to-polymer bonding, fusion bonding, or other bonding techniques. In other words, other than the bonding surface BS formed by hybrid bonding, the first inspection process is also application to the bonding surface BS formed by metal-to-metal bonding, polymer-to-polymer bonding, fusion bonding, or other bonding techniques.

Figure 1D:
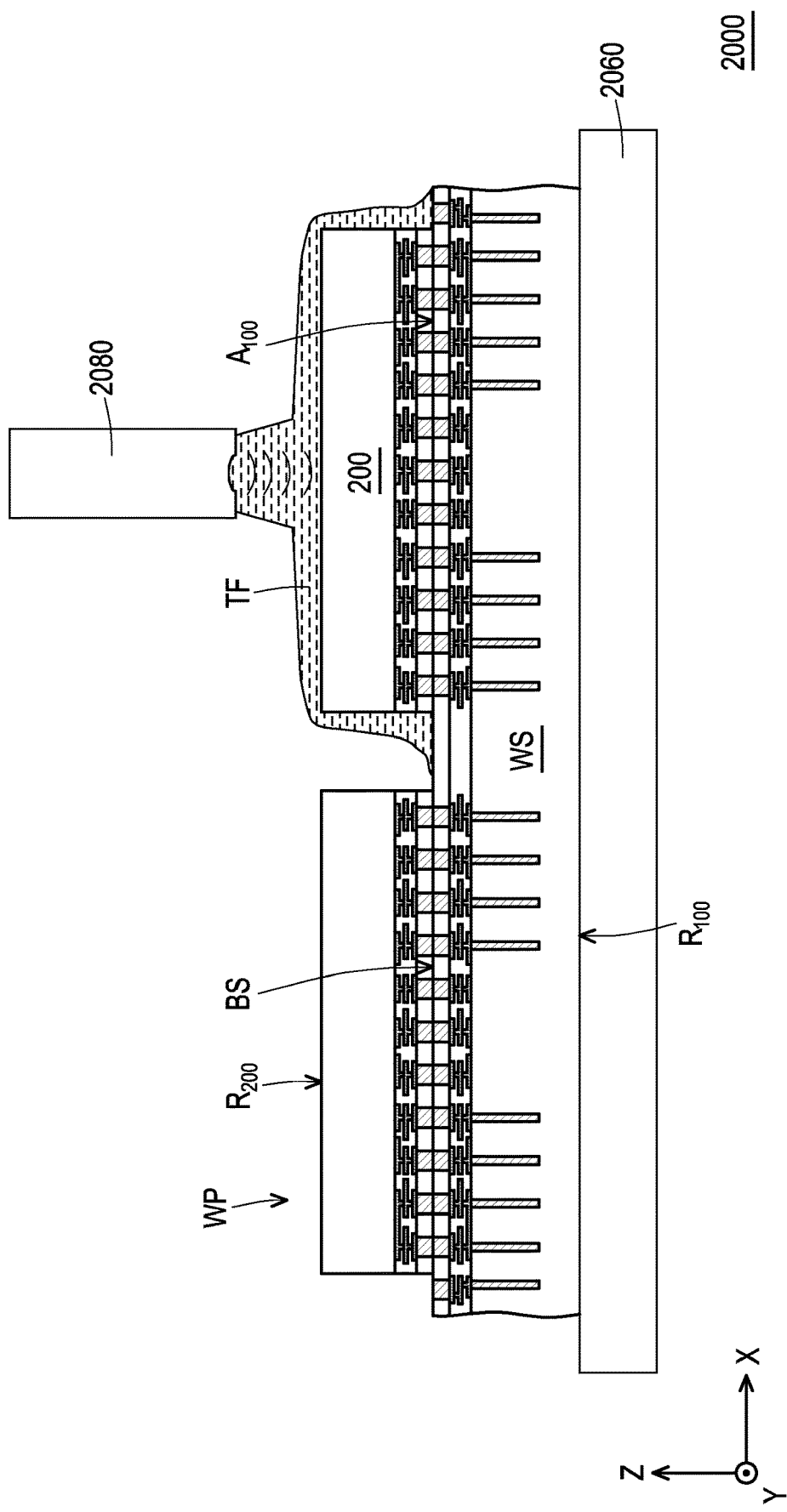

Referring to FIG. 1D, after the thermal process TP is performed to strengthen the bonding between the dies 200 and the semiconductor wafer WS, a second inspection process is performed. In some embodiments, the second inspection process is performed by an inspection apparatus 2000. The inspection apparatus 2000 in FIG. 1D may be similar to the inspection apparatus 1000 in FIG. 2, FIG. 3A to FIG. 3E, and FIG. 4A to FIG. 4E, so the detailed description thereof is omitted herein. However, the testing stage 1060 in FIG. 2, FIG. 3A to FIG. 3E, and FIG. 4A to FIG. 4E is replaced by a testing stage 2060. Unlike the testing stage 1060, the testing stage 2060 has a flat top surface and does not have a cavity. In some embodiments, the inspection apparatus 2000 includes a transducer 2080. The transducer 2080 of the inspection apparatus 2000 is similar to the transducer 1080 of the inspection apparatus 1000, so the detailed description thereof is omitted herein. In some embodiments, the second inspection process is similar to the first inspection process shown in FIG. 3A to FIG. 3E and FIG. 4A to FIG. 4E except the semiconductor workpiece WP (i.e. the semiconductor wafer WS and the dies 200) is transferred onto the testing stage 2060 in a face up manner. For example, as illustrated in FIG. 1D, the rear surface $R_{100}$ of the semiconductor wafer WS faces the testing stage 2060 and the rear surface $R_{200}$ of the dies 200 face upward. In some embodiments, the rear surface $R_{100}$ of the semiconductor wafer WS is in contact with the testing stage 2060.

As illustrated in FIG. 1D, the bonding surface BS between the semiconductor wafer WS and the dies 200 of the semiconductor workpiece WP is inspected by the transducer 2080. In some embodiments, the transducer 2080 moves along the X-direction and the Y-direction, so as to scan the semiconductor workpiece WP. In some embodiments, the transducer 2080 is able to emit/receive ultrasonic waves. By analyzing the ultrasonic waves emitted and received, the quality of the bonding surface BS of the semiconductor workpiece WP may be evaluated. In some embodiments, in order to facilitate the accuracy of the ultrasonic wave emitted/received, a medium may be provided between the transducer 2080 and the semiconductor workpiece WP. For example, as illustrated in FIG. 1D, a testing fluid TF is provided between the transducer 2080 and the semiconductor workpiece WP while the bonding surface BS of the semiconductor workpiece WP is being inspected by the transducer 2080. That is, the testing fluid TF is provided between the transducer 2080 and the rear surface $R_{200}$ of the dies 200. In some embodiments, the testing fluid TF is ejected by the transducer 2080 while the transducer 2080 is scanning the semiconductor workpiece WP. In some embodiments, the testing fluid TF includes water. However, the disclosure is not limited thereto. In some alternative embodiments, other suitable fluids may be utilized as the testing fluid TF. It should be noted that although the testing fluid TF would flow to the active surface $A_{100}$ of the semiconductor workpiece WP, since the bonding surface BS has been thermally treated and thermally annealed by the thermal process TP (i.e. the step shown in FIG. 1C), the testing fluid TF would not permeate into the bonding interface between the semiconductor wafer WS and the dies 200 to damage the bonding surface BS. In some embodiments, if defects are detected during this stage, the die 200 with defected bonding surface BS may be removed from the semiconductor wafer WS and the bonding process shown in FIG. 1B and FIG. 1C may be performed again until the quality of the bonding surface BS is ensured. As such, the yield rate of the subsequently formed integrated circuit IC may be sufficiently increased, and the quality of the subsequently formed integrated circuit IC may be ensured.

It should be noted that in some embodiments, the second inspection process illustrated in FIG. 1D may be optional. In other words, in some embodiments, the second inspection process may be omitted.

Figure 1E:
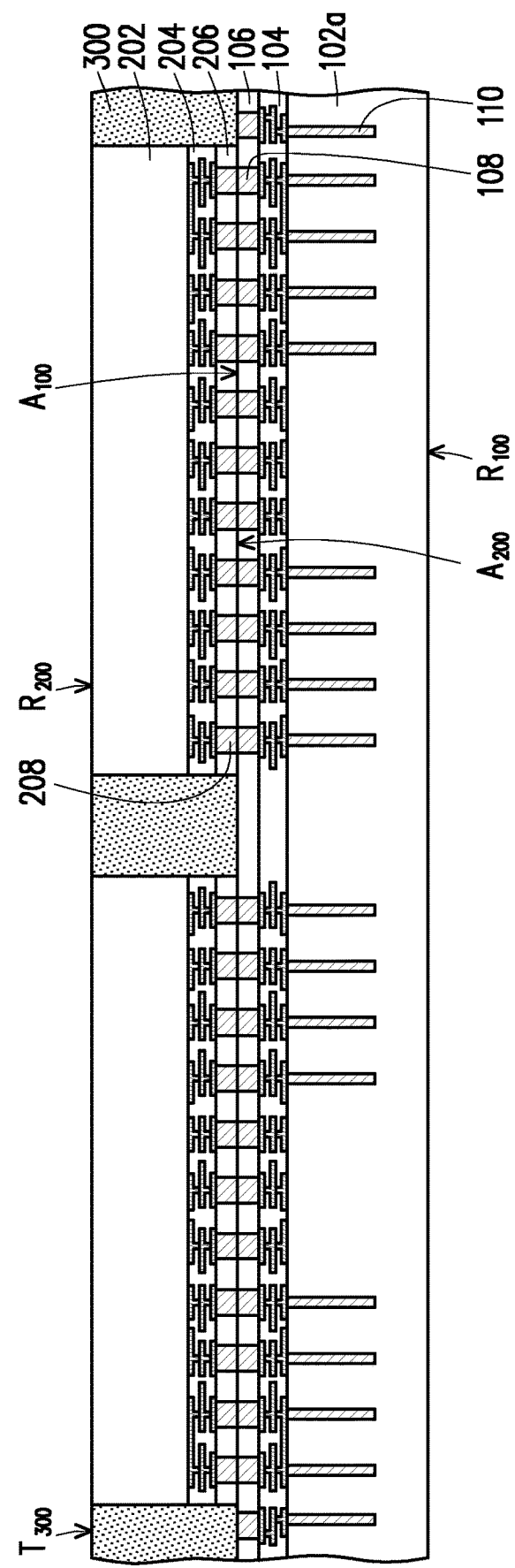

Referring to FIG. 1E, after ensuring the quality of the bonding surface BS, an encapsulant 300 is formed on the semiconductor wafer WS to laterally encapsulate the dies 200. For example, the encapsulant 300 is formed to fill in the gaps between adjacent dies 200. In some embodiments, the encapsulant 300 includes a molding compound, a molding underfill, a resin (such as epoxy), or the like. In some alternative embodiments, the encapsulant 300 may include silicon oxide and/or silicon nitride. In some embodiments, the encapsulant 300 is formed through chemical vapor deposition (CVD), plasma-enhanced chemical vapor deposition (PECVD), atomic layer deposition (ALD), or the like. In some embodiments, the encapsulant 300 is free of filler. In some embodiments, the encapsulant 300 is referred to as "gap fill oxide." In some embodiments, a planarization process is performed on the rear surfaces $R_{200}$ of the dies 200 and a top surface $T_{300}$ of the encapsulant 300 to further reduce the overall thickness of the subsequently formed integrated circuit IC. For example, a thickness of the encapsulant 300 is substantially equal to the thickness of the dies 200. Meanwhile, the top surface $T_{300}$ of the encapsulant 300 is substantially coplanar with the rear surfaces $R_{200}$ of the dies 200. That is, the thickness of the encapsulant 300 ranges from about 50 μm to about 775 μm. In some embodiments, the thickness of the encapsulant 300 ranges from about 50 μm to about 250 μm. In some embodiments, the planarization process includes a mechanical grinding process and/or a CMP process.

Figure 1F:
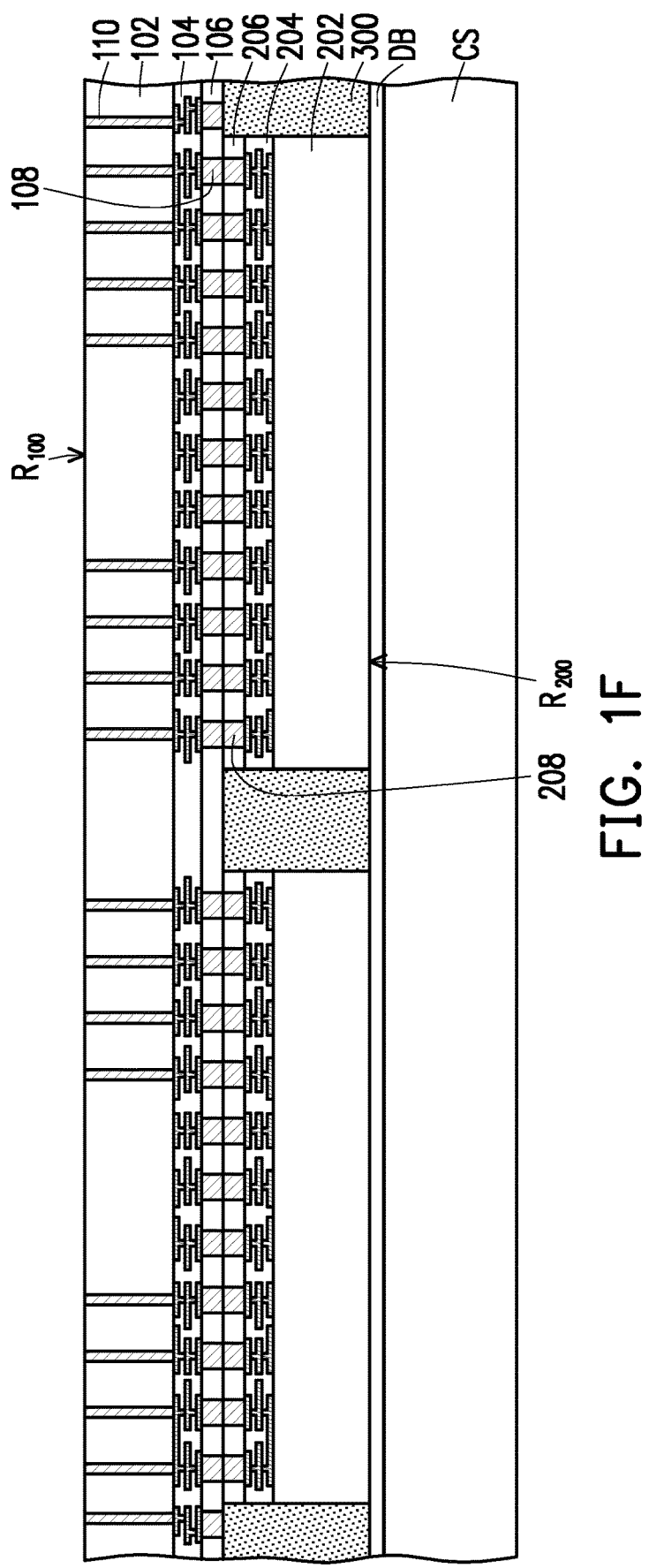

Referring to FIG. 1E and FIG. 1F, the structure illustrated in FIG. 1E is flipped upside down and is attached to a carrier CS through a de-bonding layer DB. For example, the rear surfaces $R_{200}$ of the dies 200 are attached to the de-bonding layer DB. In some embodiments, the carrier CS is a semiconductor carrier, such as a silicon carrier. However, the disclosure is not limited thereto. In some alternative embodiments, the carrier CS may be a glass carrier. In some embodiments, the de-bonding layer DB is a light-to-heat conversion (LTHC) release layer. Thereafter, a planarization process is performed on the rear surface $R_{100}$ of the semiconductor wafer WS. In some embodiments, the planarization process includes a mechanical grinding process and/or a CMP process. In some embodiments, the semiconductor substrate 102a of the semiconductor wafer WS is grinded until the TSVs 110 are revealed, so as to form a semiconductor substrate 102. For example, after the planarization process, the TSVs 110 penetrate through the semiconductor substrate 102. The TSVs 110 allow electrical communication between the front side and the back side of the semiconductor wafer WS. In some embodiments, after the TSVs 110 are revealed, the semiconductor wafer WS is further grinded to reduce the overall thickness of the semiconductor wafer WS. For example, after the grinding process, a thickness of the semiconductor wafer WS may range between about 10 μm and about 20 μm. In some embodiments, after the TSVs 110 are revealed, the semiconductor substrate 102 is recessed such that each TSV 110 protrudes from the semiconductor substrate 102. Thereafter, a dielectric layer (not shown) may fill into the recess to laterally wrap around the protruded portion of each TSV 110. In some embodiments, the dielectric layer that fills into the recess includes low temperature silicon nitride or the like.

Figure 1G:
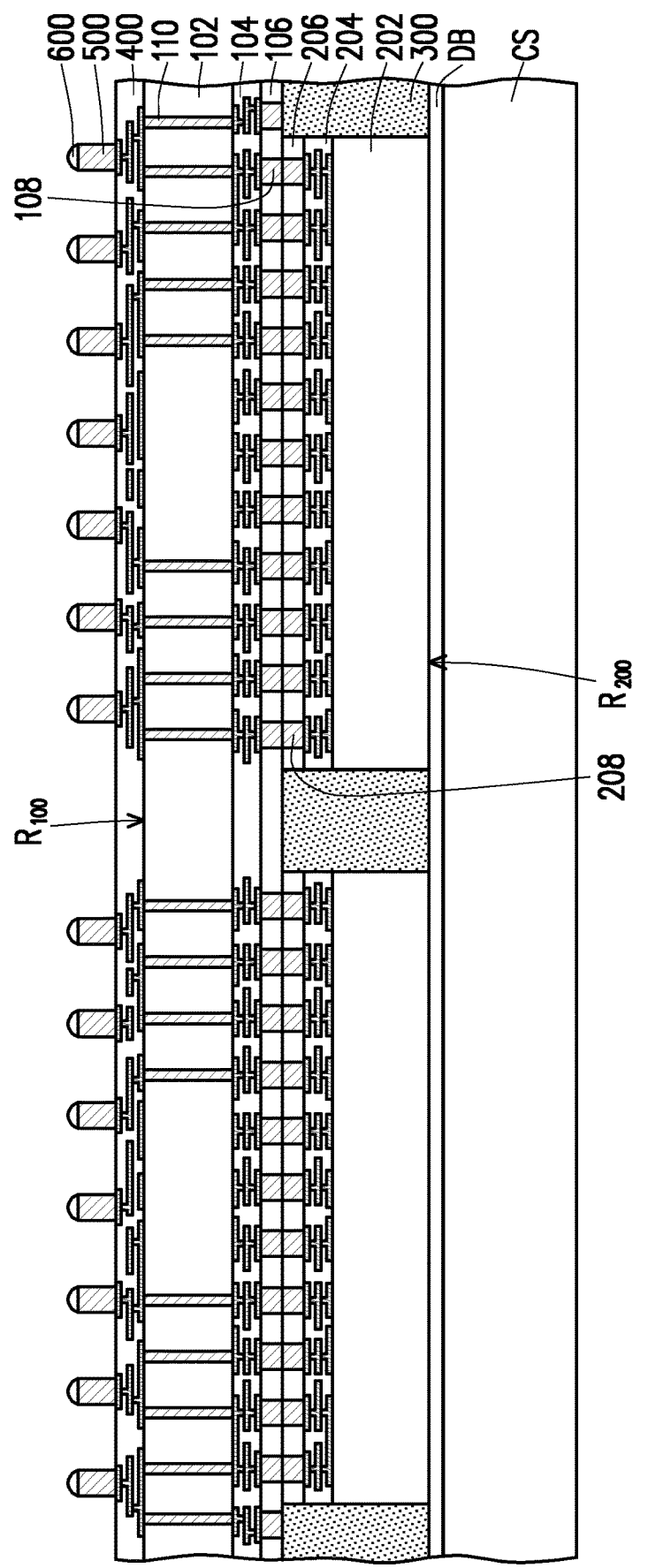

Referring to FIG. 1G, an interconnection structure 400, a plurality of conductive vias 500, and a plurality of conductive caps 600 are formed on the rear surface $R_{100}$ of the semiconductor wafer WS. The interconnection structure 400 includes a plurality of conductive patterns embedded in a dielectric material. In some embodiments, the interconnection structure 400 is electrically connected to the TSVs 110 of the semiconductor wafer WS. For example, the conductive patterns of the interconnection structure 400 may be in direct contact with the TSVs 110 of the semiconductor wafer WS to render electrical connection with the TSVs 110.

In some embodiments, the conductive vias 500 are formed on the interconnection structure 400. In some embodiments, the conductive vias 500 are formed on and directly in contact with the conductive patterns of the interconnection structure 400. That is, the conductive vias 500 are electrically connected to the dies 200 sequentially through the interconnection structure 400, the TSVs 110, the interconnection structure 104, and the conductors 108. In some embodiments, the conductive vias 500 are made of conductive materials and are plated on the conductive patterns of the interconnection structure 400. For example, a material of the conductive vias 500 may include copper, copper alloy, or the like.

In some embodiments, the conductive caps 600 are formed on the conductive vias 500. In some embodiments, the conductive caps 600 are made of a conductive material with low resistivity, such as Sn, Pb, Ag, Cu, Ni, Bi, or an alloy thereof. In some embodiments, the conductive caps 600 are temporary formed on the conductive vias 500 for electrical testing purposes. For example, testing probes (not shown) may be placed to be in physical contact with the conductive caps 600 to verify the electrical conduction and the signal transmission of the structure shown in FIG. 1G.

Figure 1H:
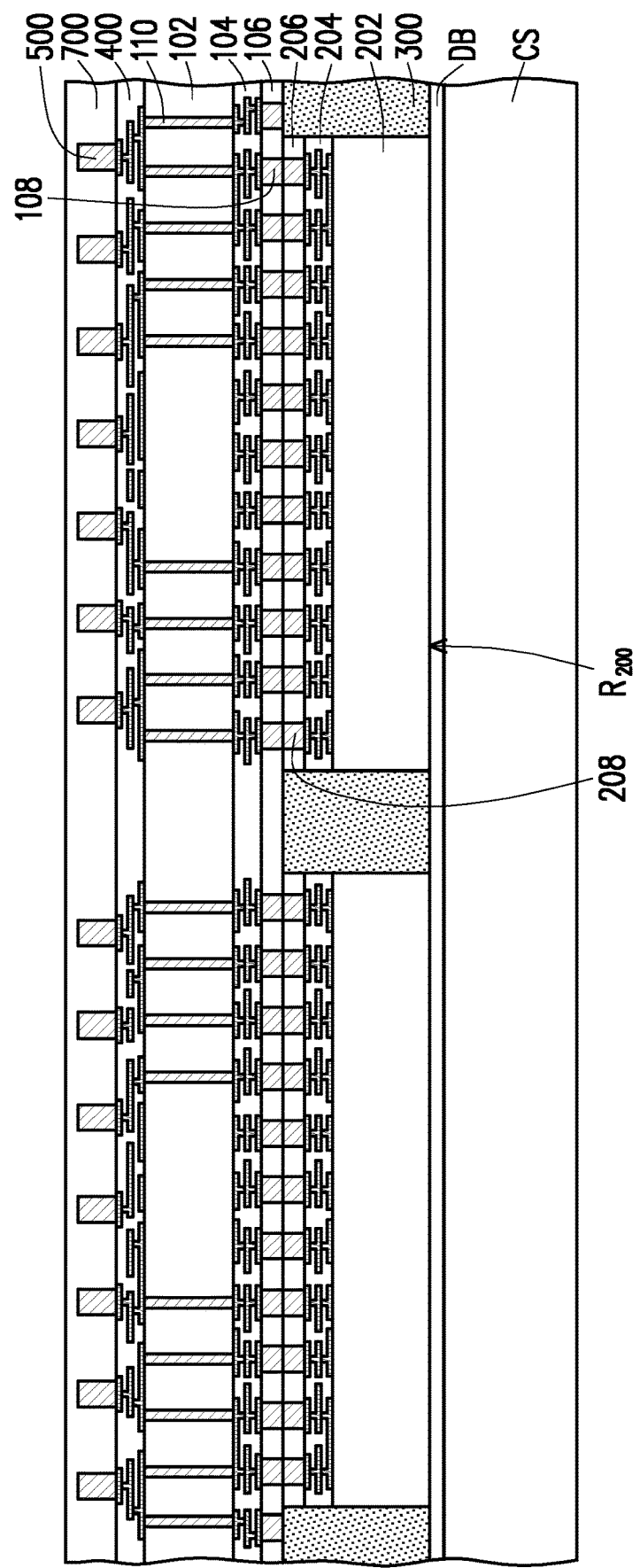

Referring to FIG. 1G and FIG. 1H, after the testing process is completed, the conductive caps 600 are removed. The conductive caps 600 may be removed by, for example, an etching process, or the like. Thereafter, a protection layer 700 is formed on the interconnection structure 400 to cover the conductive vias 500. In some embodiments, a material of the protection layer 700 includes polyimide, epoxy resin, acrylic resin, phenol resin, benzocyclobutene (BCB), polybenzoxazole (PBO), or any other suitable polymer-based dielectric material. The protection layer 700, for example, may be formed by suitable fabrication techniques such as spin-on coating, CVD, PECVD, or the like. As illustrated in FIG. 1H, the conductive vias 500 are buried within and are well-protected by the protection layer 700. However, the disclosure is not limited thereto. In some alternative embodiments, the protection layer 700 may expose top surfaces of the conductive vias 500. In some embodiments, a thickness of the protection layer 700 ranges from about 15 μm to about 25 μm.

Figure 1I:
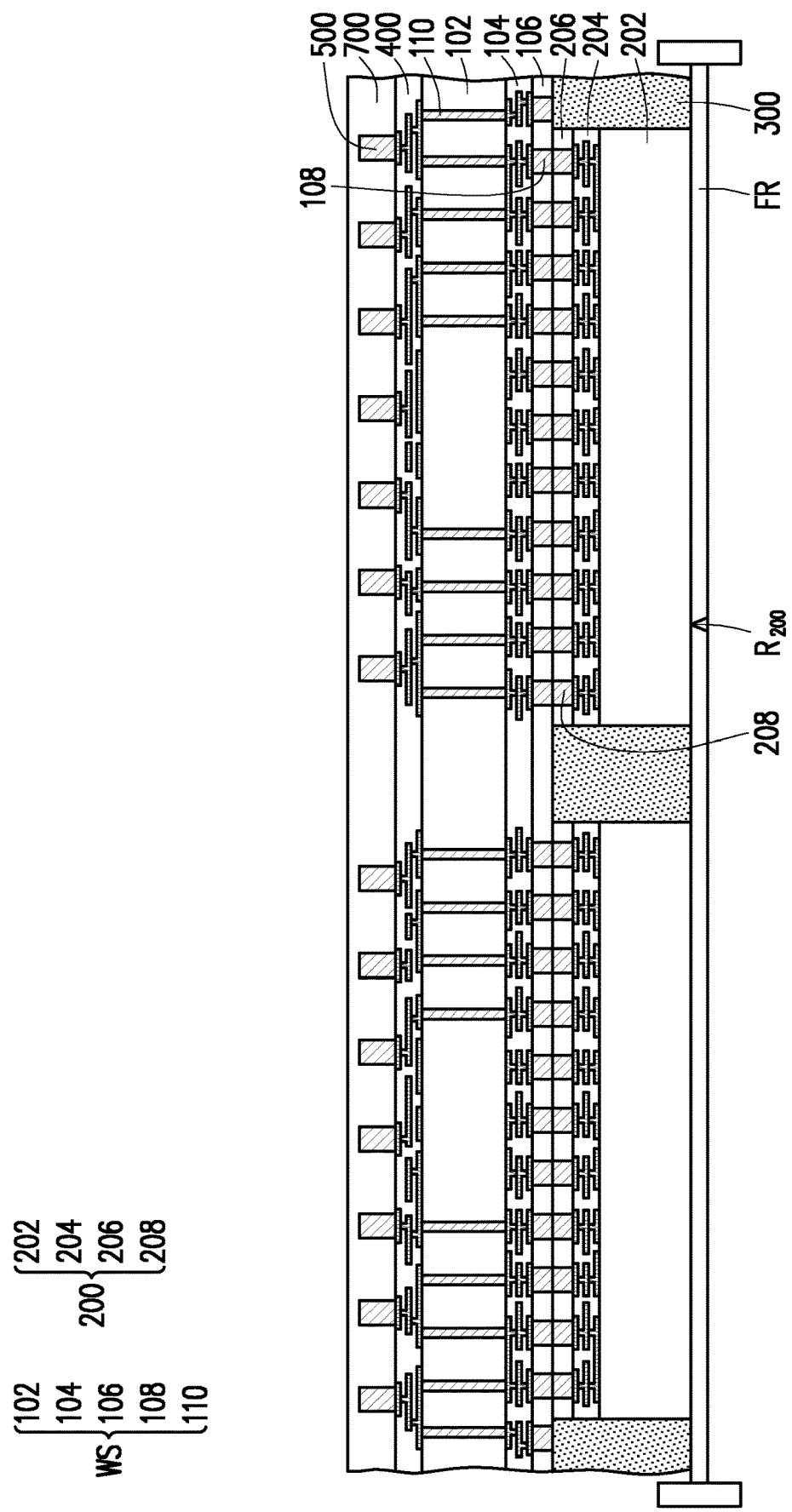

Referring to FIG. 1H and FIG. 1I, the dies 200 and the encapsulant 300 are de-bonded form the de-bonding layer DB such that the dies 200 and the encapsulant 300 are separated from the carrier CS. In some embodiments, the de-bonding layer DB (e.g., the LTHC release layer) is irradiated by an UV laser such that the de-bonding layer DB and the carrier CS may be peeled off from the dies 200 and the encapsulant 300. After the de-bonding process, the de-bonded structure is placed on a frame structure FR for further processing. In some embodiments, the frame structure FR includes a dicing tape, and the de-bonded structure is placed on the dicing tape.

Figure 1J:
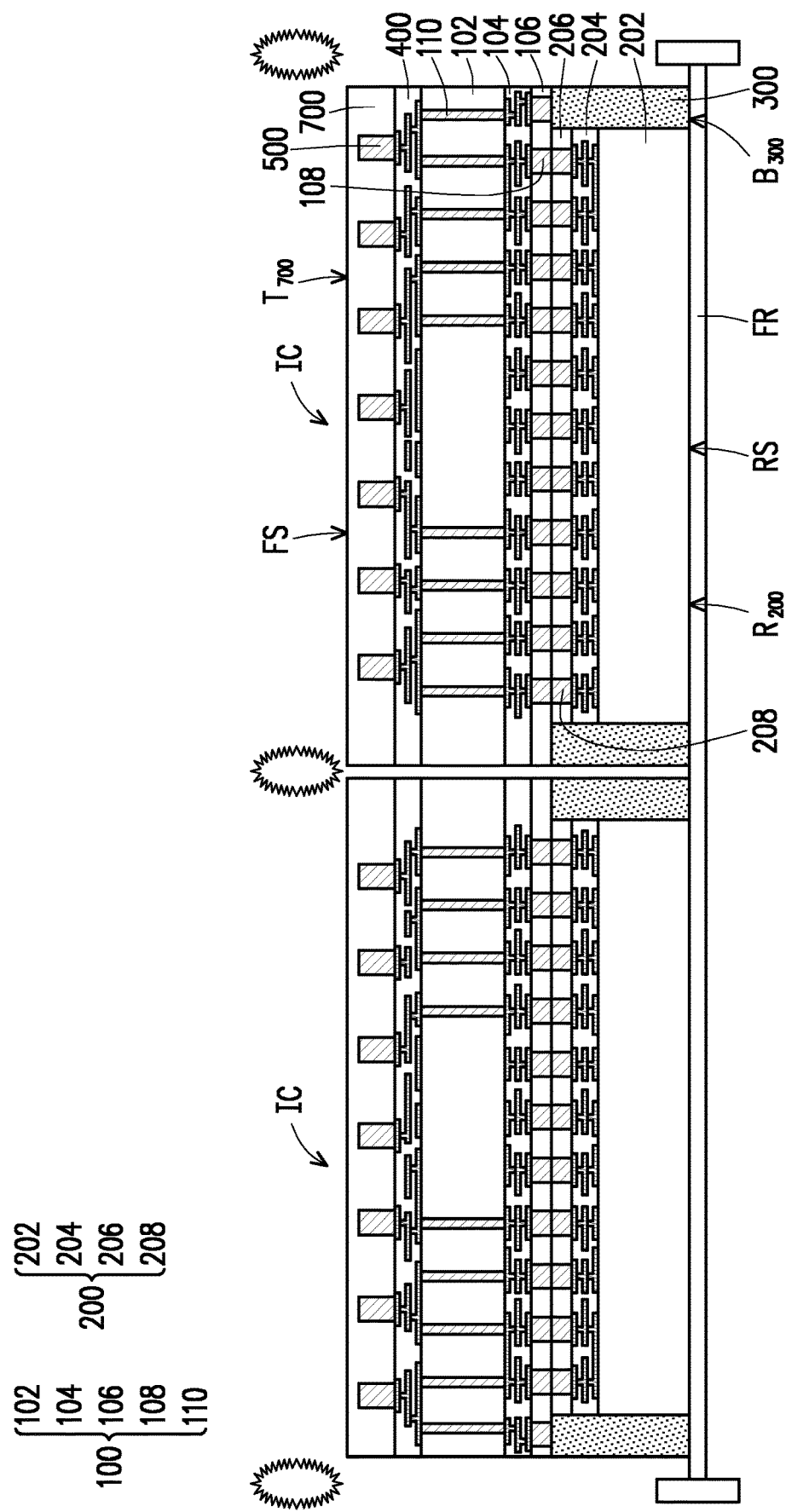

Referring to FIG. 1I and FIG. 1J, a singulation process is performed on the de-bonded structure to obtain a plurality of integrated circuits IC. In some embodiments, the singulation process typically involves dicing with a rotating blade or a laser beam. In other words, the singulation process is, for example, a laser cutting process, a mechanical cutting process, or other suitable processes. In some embodiments, the singulation process divides the semiconductor wafer WS into a plurality of dies 100. That is, each die 100 includes the semiconductor substrate 102, the interconnection structure 104, the dielectric layer 106, the conductors 108, and the TSVs 110. In some embodiments, the dies 100 are capable of performing logic functions. For example, the dies 100 may be CPU dies, GPU dies, FPGA, or the like. In some embodiments, each integrated circuit IC includes the die 100, the die 200, the encapsulant 300, the interconnection structure 400, the conductive vias 500, and the protection layer 700. The die 200 is stacked on and bonded to the die 100. Meanwhile, the encapsulant 300 laterally encapsulates the die 200. In some embodiments, the interconnection structure 400 is disposed on the die 100 opposite to the die 200. The conductive vias 500 and the protection layer 700 are disposed on the interconnection structure 400. As illustrated in FIG. 1J, each integrated circuit IC has a front surface FS and a rear surface RS opposite to the front surface FS. For example, the rear surface $R_{200}$ of the die 200 and a bottom surface $B_{300}$ of the encapsulant 300 constitute the rear surface RS of the integrated circuit IC. Meanwhile, a top surface $T_{700}$ of the protection layer 700 constitutes the front surface FS of the integrated circuit IC.

In some embodiments, the integrated circuit IC is utilized in various applications. For example, the integrated circuit IC may be packaged with other package structures to form a semiconductor device.

In accordance with some embodiments of the disclosure, an inspection apparatus for inspecting a semiconductor workpiece includes a testing stage, a first seal member, a testing clamp, a second seal member, a semiconductor workpiece, and a transducer. The testing stage has a cavity. The first seal member is disposed in the cavity. The first seal member is attached to a sidewall of the cavity. The testing clamp is movably coupled to the testing stage. The second seal member is attached to the testing clamp. The semiconductor workpiece is held between the testing stage and the testing clamp by the first seal member and the second seal member. The transducer is movably disposed above the testing stage.

In accordance with some embodiments of the disclosure, a manufacturing method of an integrated circuit includes at least the following steps. A semiconductor wafer having an active surface and a rear surface opposite to the active surface is provided. Dies are pre-bonded onto the semiconductor wafer. Each die has an active surface and a rear surface opposite to the active surface. The active surface of the semiconductor wafer and the active surfaces of the dies form a bonding surface. A first inspection process for inspecting the bonding surface is performed. A thermal process is performed on the dies and the semiconductor wafer after the first inspection process, so as to securely bond the dies onto the semiconductor wafer. An encapsulant is formed on the semiconductor wafer to laterally encapsulate the dies. An interconnection structure and conductive vias are formed over the rear surface of the semiconductor wafer. The semiconductor wafer and the encapsulant are singulated. The first inspection process includes at least the following steps. The semiconductor wafer and the dies are transferred onto a first testing stage. The first testing stage has a cavity and the rear surfaces of the dies face the cavity. The semiconductor wafer and the dies are clamped to the first testing stage by a testing clamp. The bonding surface is inspected by a first transducer. A first testing fluid is provided between the first transducer and the rear surface of the semiconductor wafer. The rear surface of the semiconductor wafer is dried.

In accordance with some embodiments of the disclosure, an inspection method includes at least the following steps. A semiconductor workpiece is provided. The semiconductor workpiece includes a semiconductor wafer and dies. The semiconductor wafer has an active surface and a rear surface opposite to the active surface, and the dies are bonded onto the active surface of the semiconductor wafer. A defect of a bonding surface between the dies and the semiconductor wafer of the semiconductor workpiece is detected using an inspection apparatus. The inspection apparatus includes a testing stage, a first seal member, a testing clamp, a second seal member, and a transducer. The testing stage has a cavity, the first seal member is disposed in the cavity, and the second seal member is attached to the testing clamp. The defect is detected by at least the following steps. The semiconductor workpiece is transferred onto the testing stage. The active surface of the semiconductor wafer is in contact with the first seal member. The semiconductor workpiece is clamped to the testing stage by the testing clamp. The rear surface of the semiconductor wafer is in contact with the second seal member. The bonding surface is inspected by the transducer while providing a testing fluid between the transducer and the semiconductor workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of an integrated circuit, comprising:
    providing a semiconductor wafer having an active surface and a rear surface opposite to the active surface;
    pre-bonding dies onto the semiconductor wafer, wherein each die has an active surface and a rear surface opposite to the active surface, and the active surface of the semiconductor wafer and the active surfaces of the dies form a bonding surface;
    performing a first inspection process for inspecting the bonding surface, comprising:
        transferring the semiconductor wafer and the dies onto a first testing stage, where the first testing stage has a cavity and the rear surfaces of the dies face the cavity;
        clamping the semiconductor wafer and the dies to the first testing stage by a testing clamp;
        inspecting the bonding surface by a first transducer, wherein a first testing fluid is provided between the first transducer and the rear surface of the semiconductor wafer; and
        drying the rear surface of the semiconductor wafer;
    performing a thermal process on the dies and the semiconductor wafer after the first inspection process, so as to securely bond the dies onto the semiconductor wafer;
    forming an encapsulant on the semiconductor wafer to laterally encapsulate the dies;
    forming an interconnection structure and conductive vias over the rear surface of the semiconductor wafer; and
    singulating the semiconductor wafer and the encapsulant.

2. The method of claim 1, further comprising a second inspection process for inspecting the bonding surface, comprising:
    transferring the semiconductor wafer and the dies onto a second testing stage, wherein the rear surface of the semiconductor wafer faces the second testing stage; and
    inspecting the bonding surface by a second transducer, wherein a second testing fluid is provided between the second transducer and the rear surface of the dies.

3. The method of claim 2, wherein the second inspection process is performed after the thermal process.

4. The method of claim 1, wherein the first testing fluid is ejected from the first transducer.

5. The method of claim 1, wherein after the semiconductor wafer and the dies are clamped to the first testing stage, an air gap is formed between the semiconductor wafer and the first testing stage, and the dies are sealed between the semiconductor wafer and the first testing stage and are surrounded by the air gap.

6. The method of claim 1, wherein the first testing stage and the testing clamp are located in a testing tank, and the first inspection process further comprises:
    after the semiconductor wafer and the dies are clamped to the first testing stage by the testing clamp, securely fixing the testing clamp onto the first testing stage through fasteners such that an air gap is formed between the semiconductor wafer and the first testing stage, and the dies are sealed between the semiconductor wafer and the first testing stage and are surrounded by the air gap; and
    filling the testing tank with the first testing fluid.

7. The method of claim 1, wherein drying the rear surface of the semiconductor wafer comprises:
    blow drying the rear surface of the semiconductor wafer when the semiconductor wafer and the dies are clamped on the first testing stage;
    after blow drying the rear surface of the semiconductor wafer, transferring the semiconductor wafer and the dies onto a drying stage; and
    spin drying the semiconductor wafer and the dies.

8. The method of claim 1, wherein the first testing fluid comprises water.

9. An inspection method, comprising:
    providing a semiconductor workpiece, wherein the semiconductor workpiece comprises a semiconductor wafer and dies, the semiconductor wafer has an active surface and a rear surface opposite to the active surface, and the dies are bonded onto the active surface of the semiconductor wafer; and
    detecting a defect of a bonding surface between the dies and the semiconductor wafer of the semiconductor workpiece using an inspection apparatus, wherein the inspection apparatus comprises a testing stage, a first seal member, a testing clamp, a second seal member, and a transducer, the testing stage has a cavity, the first seal member is disposed in the cavity, the second seal member is attached to the testing clamp, and detecting the defect comprises:
  transferring the semiconductor workpiece onto the testing stage, wherein the active surface of the semiconductor wafer is in contact with the first seal member;
  clamping the semiconductor workpiece to the testing stage by the testing clamp, wherein the rear surface of the semiconductor wafer is in contact with the second seal member; and
  inspecting the bonding surface by the transducer while providing a testing fluid between the transducer and the semiconductor workpiece.

10. The method of claim 9, wherein detecting the defect further comprises:
  blow drying the rear surface of the semiconductor wafer after the bonding surface is inspected.

11. The method of claim 10, wherein the inspection apparatus further comprises a drying stage adjacent to the testing stage, and detecting the defect further comprises:
  transferring the semiconductor workpiece onto a drying stage after the rear surface of the semiconductor wafer is blow dried; and
  spin drying the semiconductor workpiece.

12. The method of claim 9, wherein the testing fluid is ejected from the transducer.

13. The method of claim 9, wherein the inspection apparatus further comprises a testing tank, the testing stage and the testing clamp are located in the testing tank, and detecting the defect further comprises:
  after the semiconductor workpiece is clamped to the testing stage by the testing clamp, securely fixing the testing clamp onto the testing stage through fasteners such that an air gap is formed between the semiconductor wafer and the testing stage, and the dies are sealed between the semiconductor wafer and the testing stage and are surrounded by the air gap; and
  filling the testing tank with the testing fluid.

14. The method of claim 9, wherein the testing fluid comprises water.

15. A manufacturing method of an integrated circuit, comprising:
  providing a semiconductor wafer;
  pre-bonding dies onto the semiconductor wafer;
  performing a first inspection process for inspecting bonding surfaces between the semiconductor wafer and the dies, comprising:
    transferring the semiconductor wafer and the dies onto a first testing stage, where the first testing stage has a cavity, and the dies are placed within the cavity;
    clamping the semiconductor wafer to the first testing stage by a testing clamp such that the dies are sealed in the cavity; and
    inspecting the bonding surfaces by a first transducer, wherein a first testing fluid is provided between the first transducer and the semiconductor wafer, and the first testing fluid stays at a surface of the semiconductor wafer opposite to the bonding surfaces;
  securely bonding the dies to the semiconductor wafer after the first inspection process;
  forming an encapsulant on the semiconductor wafer to laterally encapsulate the dies;
  forming an interconnection structure on the semiconductor wafer opposite to the dies and the encapsulant; and
  singulating the semiconductor wafer and the encapsulant.

16. The method of claim 15, wherein securely bonding the dies to the semiconductor wafer comprises performing a thermal process on the dies and the semiconductor wafer.

17. The method of claim 15, further comprising performing a second inspection process for inspecting the bonding surfaces, comprising:
  after securely bonding the dies to the semiconductor wafer, transferring the semiconductor wafer and the dies onto a second testing stage; and
  inspecting the bonding surfaces by a second transducer, wherein a second testing fluid is provided between the second transducer and the dies.

18. The method of claim 15, wherein the first testing fluid is ejected from the first transducer.

19. The method of claim 15, wherein the first inspection process further comprises:
  after inspecting the bonding surfaces by the first transducer, blow drying the surface of the semiconductor wafer;
  after blow drying the surface of the semiconductor wafer, transferring the semiconductor wafer and the dies onto a drying stage; and
  spin drying the semiconductor wafer and the dies.

20. The method of claim 15, wherein the first testing fluid comprises water.

* * * * *